United States Patent
Sreenivasan et al.

(10) Patent No.: US 9,972,699 B1
(45) Date of Patent: May 15, 2018

(54) FABRICATING LARGE AREA MULTI-TIER NANOSTRUCTURES

(71) Applicant: Board of Regents, The University of Texas System, Austin, TX (US)

(72) Inventors: Sidlgata V. Sreenivasan, Austin, TX (US); Praveen Joseph, Austin, TX (US); Ovadia Abed, Austin, TX (US); Michelle Grigas, Austin, TX (US); Akhila Mallavarapu, Austin, TX (US); Paras Ajay, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days. days.

(21) Appl. No.: 15/905,024

(22) Filed: Feb. 26, 2018

Related U.S. Application Data

(62) Division of application No. 15/133,007, filed on Apr. 19, 2016, now Pat. No. 9,941,389.

(Continued)

(51) Int. Cl.
*H01L 29/66* (2006.01)
*H01L 21/311* (2006.01)
(Continued)

(52) U.S. Cl.
CPC .......... *H01L 29/6659* (2013.01); *G02B 6/124* (2013.01); *G03F 7/0002* (2013.01); *H01L 21/0271* (2013.01); *H01L 21/0337* (2013.01); *H01L 21/2855* (2013.01); *H01L 21/3081* (2013.01); *H01L 21/3086* (2013.01); *H01L 21/30604* (2013.01); *H01L 21/31144* (2013.01); *H01L 21/76224* (2013.01); *H01L 29/6653* (2013.01); *H01L 29/66515* (2013.01);
(Continued)

(58) Field of Classification Search
CPC ............. H01L 29/6659; H01L 21/2855; H01L 21/30604
See application file for complete search history.

(56) References Cited

U.S. PATENT DOCUMENTS 7,202,179 B2    4/2007   Taussig et al.
2010/0009470 A1 1/2010   Davis et al.
(Continued)

OTHER PUBLICATIONS

International Preliminary Report on Patentability for International Application No. PCT/US2016/028302 dated Nov. 2, 2017, pp. 1-8.

(Continued)

*Primary Examiner* — Errol Fernandes
(74) *Attorney, Agent, or Firm* — Robert A. Voigt, Jr.; Winstead, P.C.

(57) ABSTRACT

Methods for fabricating and replicating self-aligned multi-tier nanoscale structures for a variety of cross-sectional geometries. These methods can utilize a single lithography step whereby the need for alignment and overlay in the process is completely eliminated thereby enabling near-zero overlay error. Furthermore, techniques are developed to use these methods to fabricate self-aligned nanoscale multi-level/multi-height patterns with various shapes for master templates, replica templates and nanoimprint based pattern replication. Furthermore, the templates can be used to pattern multiple levels in a sacrificial polymer resist and achieve pattern transfer of the levels into a variety of substrates to form completed large area nanoelectronic and nanophotonic devices using only one patterning step.

12 Claims, 34 Drawing Sheets

Related U.S. Application Data

(60) Provisional application No. 62/149,784, filed on Apr. 20, 2015.

(51) Int. Cl.
| | |
|---|---|
| *H01L 21/308* | (2006.01) |
| *H01L 21/306* | (2006.01) |
| *H01L 21/762* | (2006.01) |
| *H01L 21/285* | (2006.01) |
| *G02B 6/124* | (2006.01) |
| *G03F 7/00* | (2006.01) |
| *H01L 21/033* | (2006.01) |
| *H01L 21/027* | (2006.01) |
| *H01L 21/02* | (2006.01) |
| *H01L 49/02* | (2006.01) |

(52) U.S. Cl.
CPC .... *H01L 29/66545* (2013.01); *H01L 21/0228* (2013.01); *H01L 21/02164* (2013.01); *H01L 28/90* (2013.01); *H01L 29/665* (2013.01)

(56) References Cited

U.S. PATENT DOCUMENTS

| | | |
|---|---|---|
| 2010/0136792 A1 | 6/2010 | Mebarki et al. |
| 2010/0173494 A1 | 7/2010 | Kobrin |
| 2010/0215909 A1 | 8/2010 | MacDonald |
| 2013/0260557 A1 | 10/2013 | Wang et al. |
| 2015/0064912 A1 | 3/2015 | Jang et al. |
| 2015/0170973 A1 | 6/2015 | Kim et al. |

OTHER PUBLICATIONS

International Search Report and Written Opinion for International Application No. PCT/US16/28302 dated Sep. 16, 2016, pp. 1-12.

Joseph et al., "Multi-tier Nanosculpting," National Science Foundation Nanosystems Engineering Research Center (NSF-NERC) Site Visit, Nanomanufacturing Systems for Mobile Computing and Mobile Energy Technologies (NASCENT), Austin TX, Apr. 22, 2015, one page.

Joseph et al., "Novel Method for Fabrication of Sub-50nm Multi-tier Nanoimprint Lithography Templates," The 59th International Conference on Electron, Ion, and Photon Beam Technology and Nanofabrication, San Diego CA, May 27, 2015, one page.

Joseph et al., "Multi-tiered Nanosculpting," National Science Foundation Nanosystems Engineering Research Center (NSF-NERC) Industrial Advisory Board (IAB) Visit, Nanomanufacturing Systems for Mobile Computing and Mobile Energy Technologies (NASCENT), Austin TX, Dec. 16, 2015, one page.

Cherala et al., "Nanoshape Imprint Lithography for Fabrication of Nanowire Ultra-Capacitors," IEEE Transactions on Nanotechnology, Issue 99, Mar. 14, 2016, pp. 1-9.

Lausecker et al., "Self-Aligned Imprint Lithography for Top-Gate Amorphous Silicon Thin-Film Transistor Fabrication," Applied Physics Letters, vol. 96, 2010, pp. 263501-1 to 263501-3.

Johnson et al., "Fabrication of Multi-Tiered Structures on Step and Flash Imprint Lithography Templates," Microelectronic Engineering 67-68, 2003, pp. 221-228.

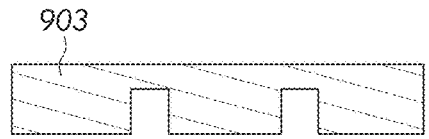
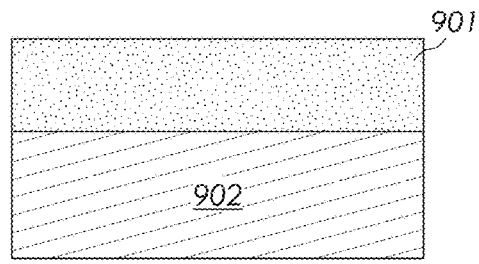
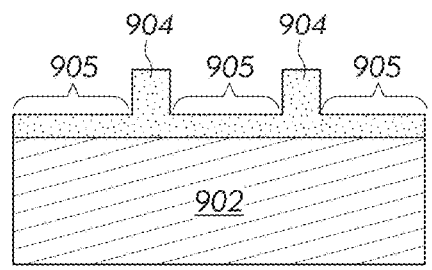
FIG. 9A    FIG. 9B
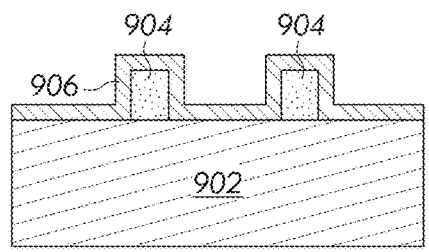
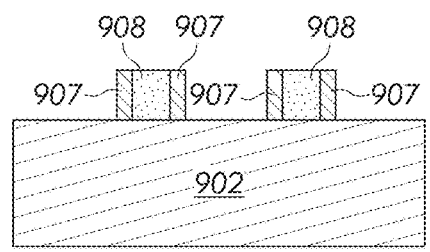
FIG. 9C    FIG. 9D
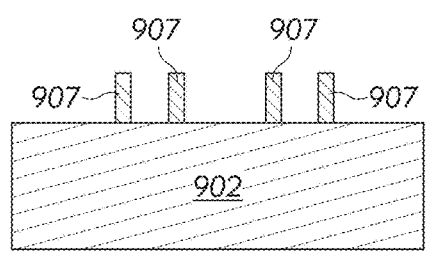
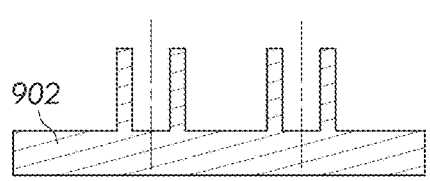
FIG. 9E    FIG. 9F

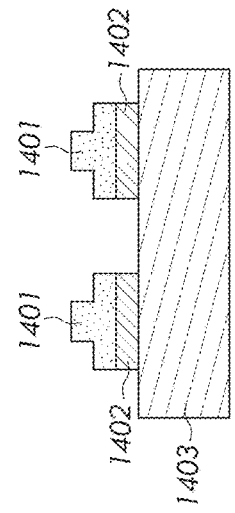
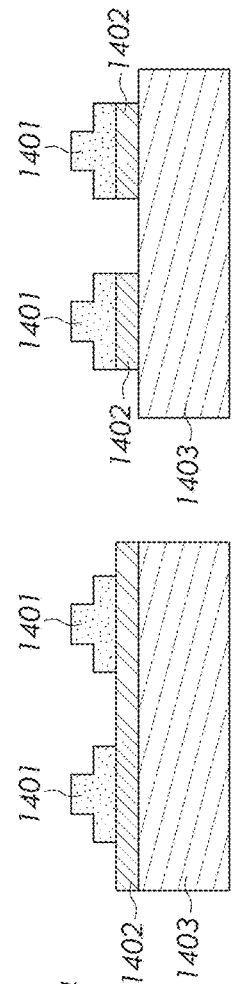
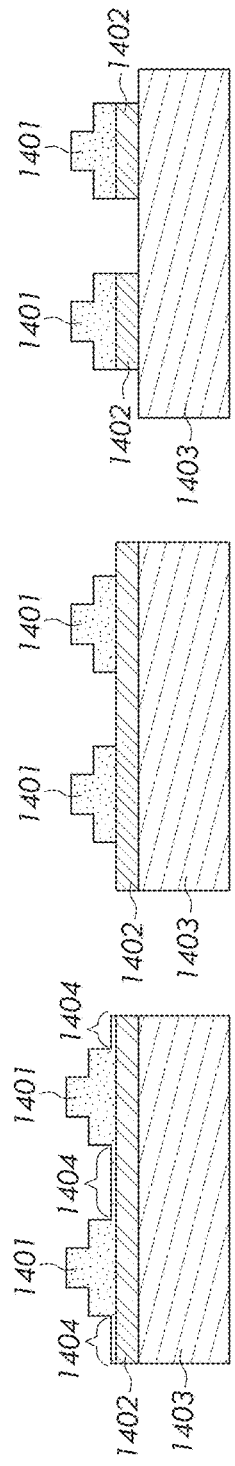
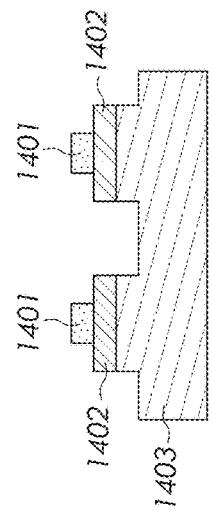
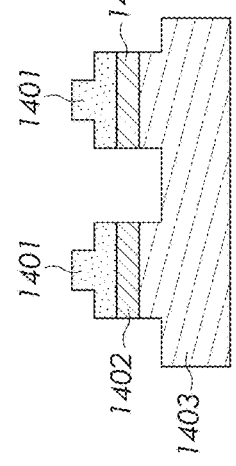
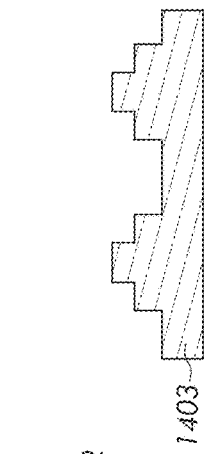
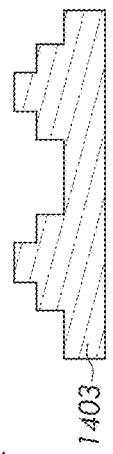
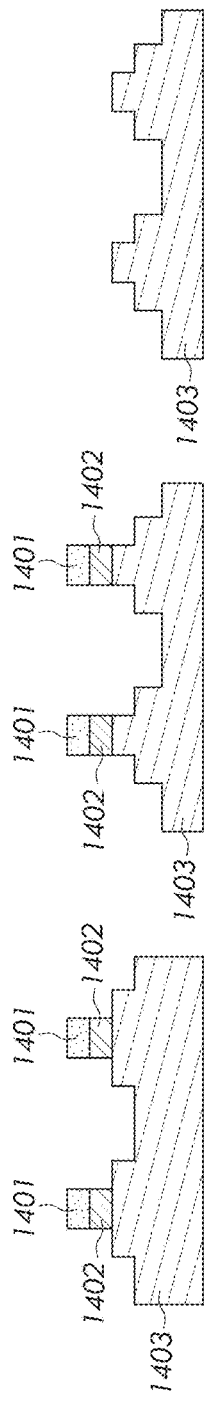

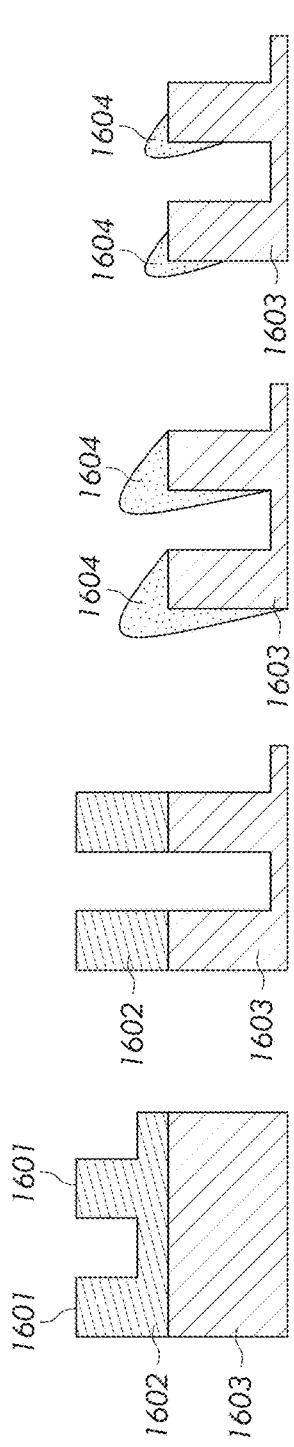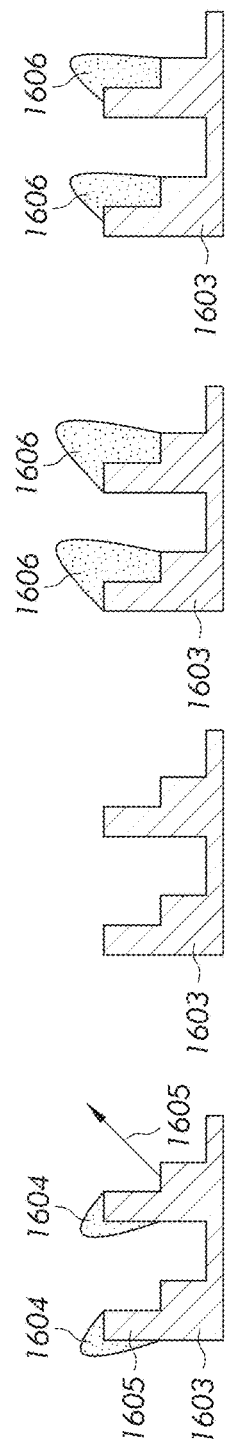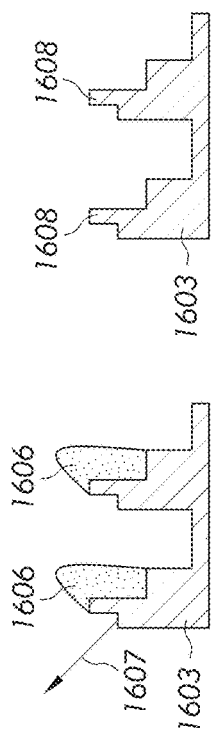

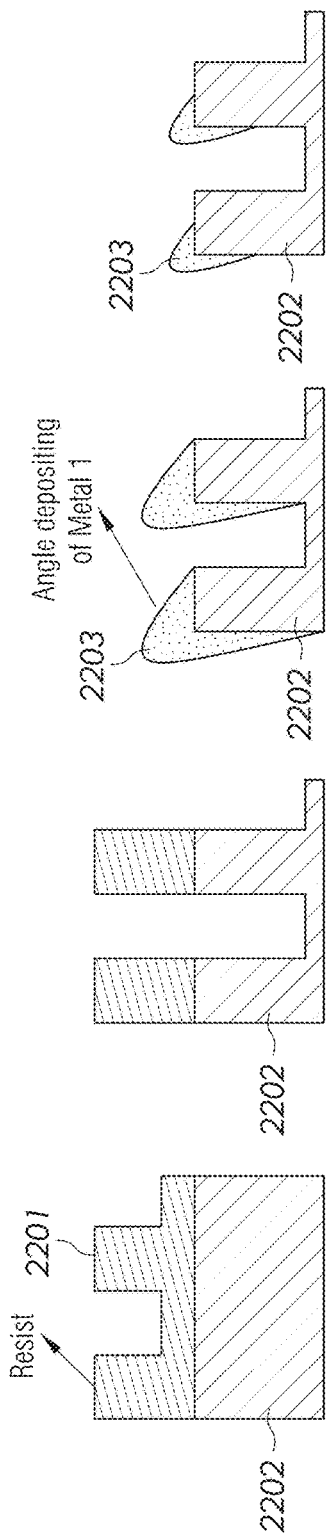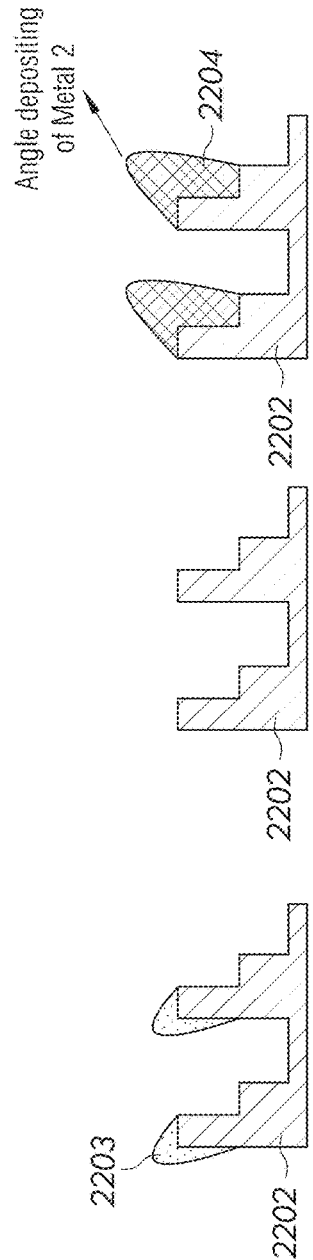

FABRICATING LARGE AREA MULTI-TIER NANOSTRUCTURES

GOVERNMENT INTERESTS

This invention was made with government support under Grant No. EEC1160494 awarded by the National Science Foundation. The U.S. government has certain rights in the invention.

TECHNICAL FIELD

The present invention relates generally to nanoimprint lithography, and more particularly to fabricating multi-tier nanostructures using a single lithography step without the need for alignment and overlay in the process.

BACKGROUND

Nanoimprint lithography is a high throughput, low-cost lithographic technique that has demonstrated sub-10 nm feature resolution and is widely accepted as one of the potential successors to optical lithography. Currently, multi-tier nanostructures can only be achieved by using multiple lithography steps, with intermediate nanoscale alignment and overlay steps. As critical dimensions scale down with advancing technology nodes, nanoscale alignment and overlay have become increasingly more challenging. These challenges need to be addressed for nanoimprint lithography to be used for patterning high density multi-level nanoelectronic circuits.

Thus, there is a need for techniques that can enable patterning of multiple levels or tiers of nanoscale structures without employing intermediate alignment or overlay steps in order to aid continued scaling down of critical dimensions.

SUMMARY

In one embodiment of the present invention, a method for fabricating a bilaterally symmetric multi-tier structure comprises patterning a pair of grating structures on a substrate material. The method further comprises transferring the patterned pair of grating structures into the substrate material using a resist mask. The method additionally comprises removing the resist mask. Furthermore, the method comprises depositing spacer material until an empty space within each of the pair of grating structures is filled. Additionally, the method comprises etching the spacer material anisotropically to define side wall spacers on the outer edges of the pair of grating structures. In addition, the method comprises etching the substrate material using the side wall spacers as an etch mask to form a second lower level. The method further comprises removing the spacer material to reveal a bilaterally symmetric multi-tier structure.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIGS. 9A-9F depict cross-sectional views of fabricating self-aligned silicon tube structures in the nanoscale using the steps described in FIG. 8 in accordance with an embodiment of the present invention;

FIGS. 14A-14H depict cross-sectional views of the process for pattern transfer of multi-tier structures into the substrate material using the steps described in FIG. 13 in accordance with an embodiment of the present invention;

FIGS. 16A-16J depict cross-sectional views of fabricating multi-tier asymmetric nanostructures using the steps described in FIG. 15 in accordance with an embodiment of the present invention;

FIGS. 22A-22G depict cross-sectional views of forming asymmetric multi-tier wire grid polarizers using the steps described in FIG. 21 in accordance with an embodiment of the present invention;

DETAILED DESCRIPTION

The present invention allows the fabrication of multi-tier nanoimprint lithography templates while eliminating the alignment and overlay steps. In particular, the principles of the present invention discloses novel fabrication processes to make high resolution (sub-50 nm) multi-tier nanoimprint templates, while eliminating the need for any alignment or overlay steps.

Wire grid polarizers (WGP) are key devices that enable many nanophotonic applications, such as polarizing beam splitters, filters for infrared (IR) sensors, a liquid crystal display (LCD) projector, heads-up display in automobiles, head mounted displays, and lenses for polarized sunglasses. Parameters, such as grating pitch, duty cycle, and metal aspect ratio and thickness affect transmission and extinction ratio (ER) of a WGP. The present invention enables the fabrication of WGPs with higher metal thicknesses than existing ones, while maintaining or improving nano-grating pitch.

In one embodiment, the present invention uses nanoimprint lithography to pattern nanoscale shapes. An exemplary imprint lithography technique, known as Jet and Flash Imprint Lithography (J-FIL) is described next. A unique feature of J-FIL is that it uses a targeted resist dispense approach that allows adaptive material deposition to match pattern density variations in the template that is to be replicated. This combined with low viscosity resist formulations leads to high throughput processes.

Figure 1:
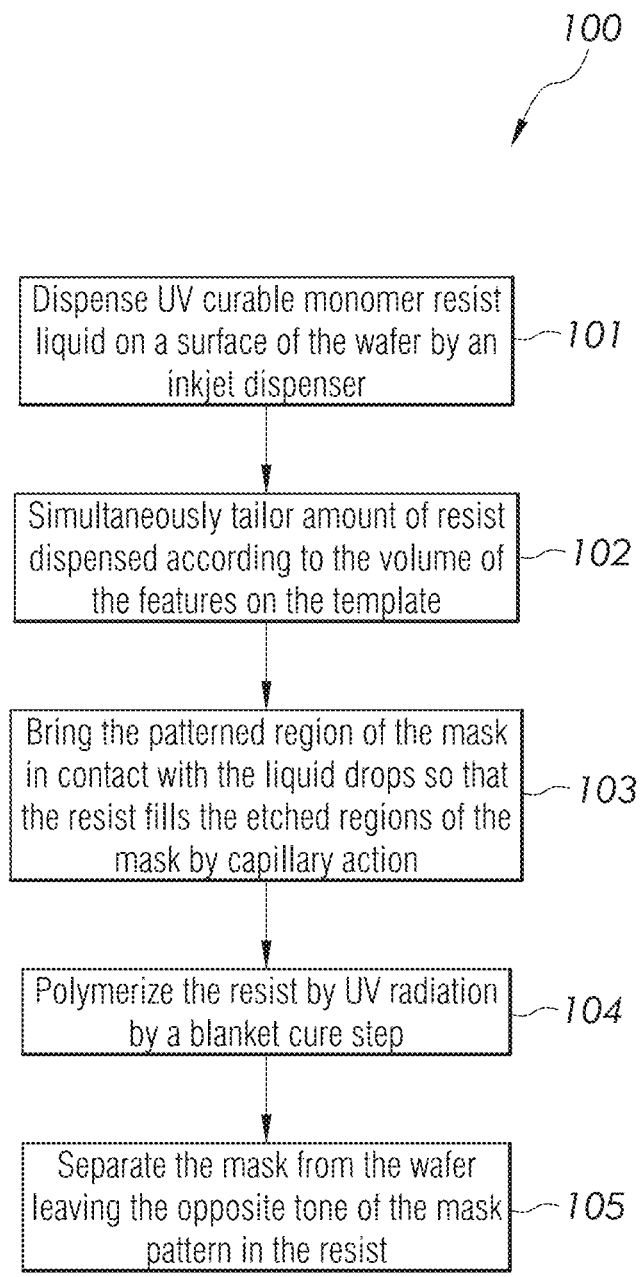
FIG. 1 is a flowchart of a method for using imprint lithography to pattern nanoscale shapes in accordance with an embodiment of the present invention.

A process for using imprint lithography to pattern nanoscale shapes is discussed below in connection with FIGS. 1 and 2A-2D. FIG. 1 is a flowchart of a method 100 for using imprint lithography to pattern nanoscale shapes in accordance with an embodiment of the present invention. FIG. 1 will be discussed in conjunction with FIGS. 2A-2D, which depict cross-sectional views of patterning nanoscale shapes using the steps described in FIG. 1 in accordance with an embodiment of the present invention.

Figure 2A:
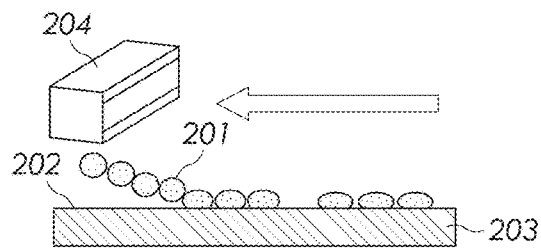
FIGS. 2A-2D depict cross-sectional views of patterning nanoscale shapes using the steps described in FIG. 1 in accordance with an embodiment of the present invention.

Referring to FIG. 1, in step 101, the UV curable monomer resist liquid 201 is dispensed on a surface 202 of the wafer 203 by an inkjet dispenser 204 as shown in FIG. 2A.

Figure 2B:
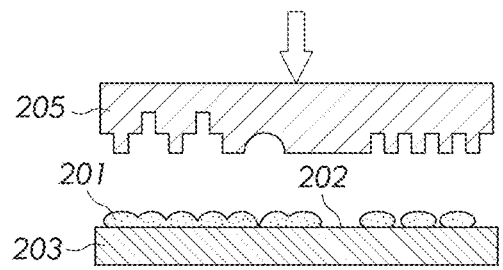

In step 102, the amount of resist dispensed is tailored simultaneously according to the volume of the features on the template 205 as shown in FIG. 2B.

Figure 2C:
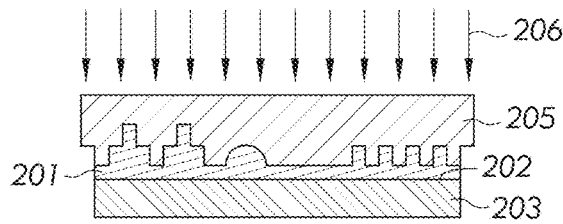

In step 103, the patterned region of the mask 205 called the field is brought in contact with the liquid drops 201 so that the resist fills the etched regions of the mask 205 by capillary action as shown in FIG. 2C.

In step 104, the resist is then polymerized by UV radiation 206 by a blanket cure step as shown in FIG. 2C.

Figure 2D:
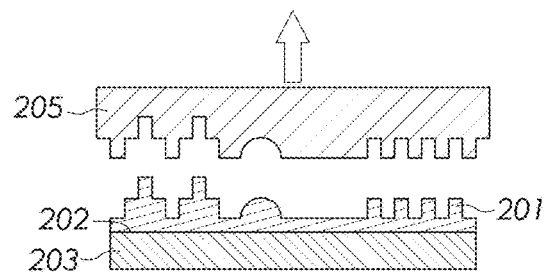

In step 105, the mask 205 is separated from the wafer leaving the opposite tone of the mask pattern in the resist 201 as shown in FIG. 2D.

Imprinting time of less than 2 seconds is made possible by dispensing a grid containing thousands of drops with drop volumes of 6 picoliters or less and advanced drop layout optimization.

Figure 3:
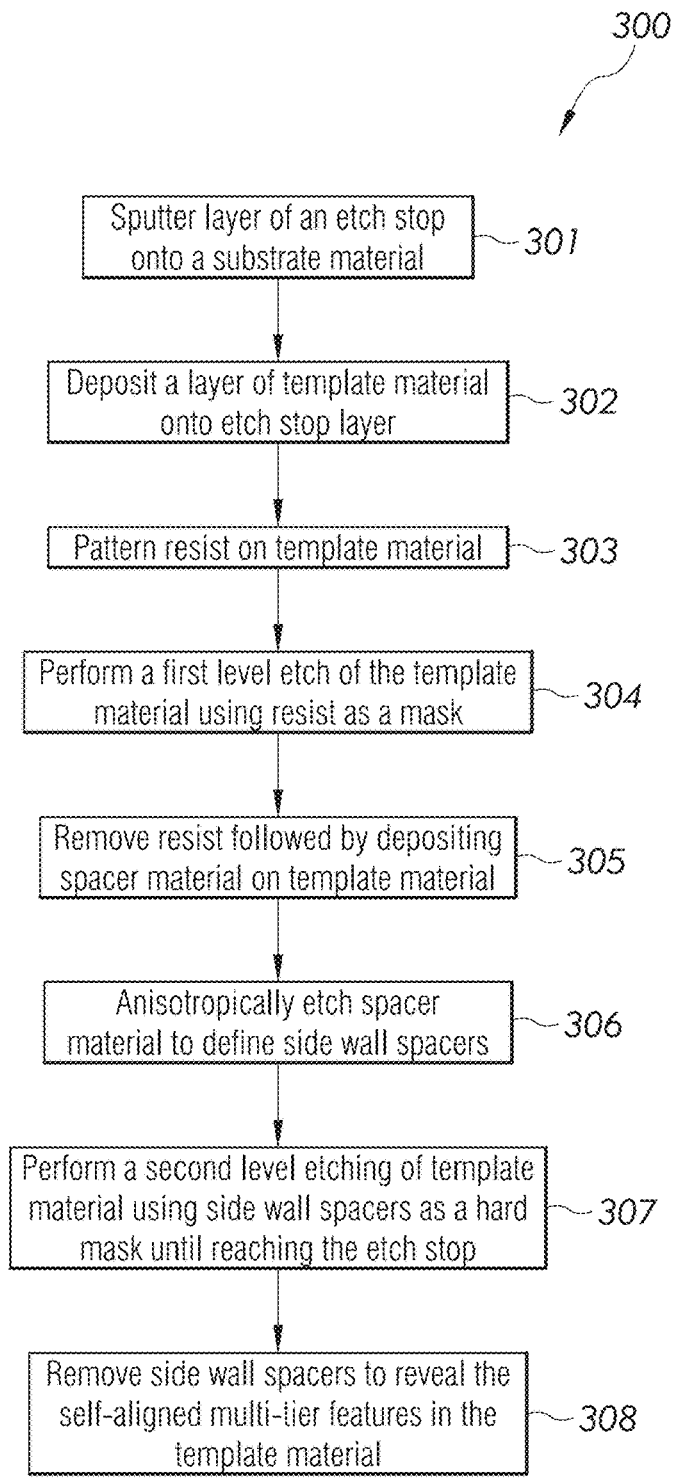
FIG. 3 is a flowchart of a method for fabricating self-aligned symmetric nanoscale multi-tier imprint templates using lithography and side wall spacers in accordance with an embodiment of the present invention.

As discussed above, the present invention utilizes a technique that uses J-FIL in conjunction with side wall deposition based patterning and RIE. The following discuses such a technique in connection with FIGS. 3 and 4A-4F. FIG. 3 is a flowchart of a method 300 for fabricating self-aligned symmetric nanoscale multi-tier imprint templates using lithography and side wall spacers in accordance with an embodiment of the present invention. FIG. 3 will be discussed in conjunction with FIGS. 4A-4F, which depict cross-sectional views of fabricating self-aligned symmetric nanoscale multi-tier imprint templates using the steps described in FIG. 3 in accordance with an embodiment of the present invention.

Referring to FIG. 3, in step 301, a layer of an etch stop 401 (e.g., silicon dioxide or a transparent conducting oxide, such as indium tin oxide (ITO)) is sputtered onto a substrate material 402. In one embodiment, substrate material 402 is fused silica since it is transparent to UV light required to polymerize liquid resist.

In step 302, a layer of a template material 403, such as silicon dioxide or silicon, is deposited on etch stop 401, such as using plasma enhanced chemical vapor deposition. In one embodiment, template material 403 was deposited on etch stop 401 at 285° C.

In step 303, resist 404 was patterned on template material 403 using one of the following techniques: nanoimprint lithography, electron beam lithography or photolithography.

Figure 4A:
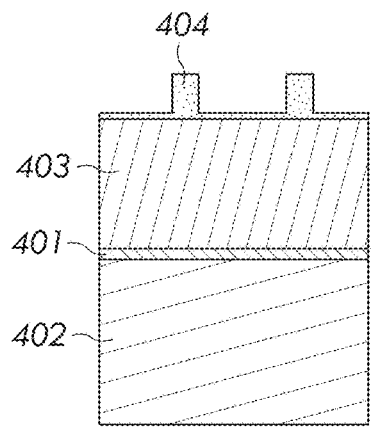
FIGS. 4A-4F depict cross-sectional views of fabricating self-aligned symmetric nanoscale multi-tier imprint templates using the steps described in FIG. 3 in accordance with an embodiment of the present invention.

The resulting structure of implementing steps 301-303 is shown in FIG. 4A.

Figure 4B:
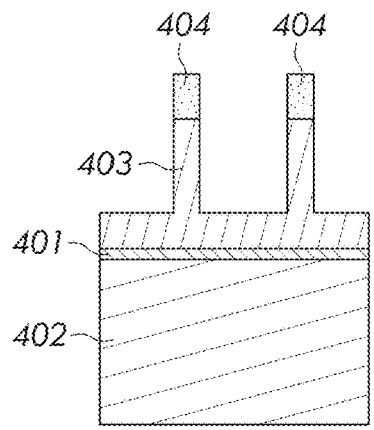

In step 304, a residual layer etching of the patterned resist 404 using Ar/O$_2$ RIE chemistry followed by a first level etching of template material 403 using resist 404 as a mask is performed as shown in FIG. 4B. In one embodiment, when the template material 403 is silicon dioxide, it is etched using CHF$_3$/Ar/CF$_4$ RIE chemistry.

Figure 4C:
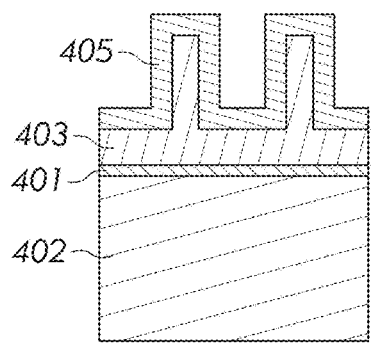

In step 305, resist mask 404 is removed using a standard piranha (H$_2$O$_2$+H$_2$SO$_4$) clean followed by depositing spacer material 405, such as silicon dioxide or titanium nitride (TiN), on template material 403 as shown in FIG. 4C.

Figure 4D:
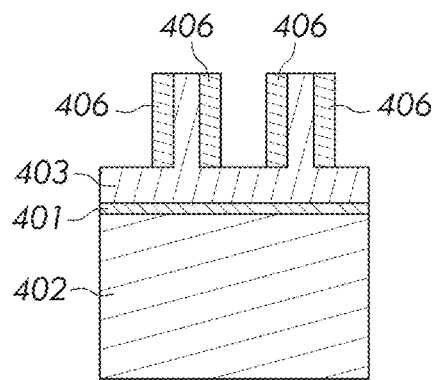

In step 306, spacer material 405 is anisotropically etched to define side wall spacers 406 as shown in FIG. 4D. In one embodiment, when spacer material 405 is TiN, Cl$_2$/Ar RIE chemistry is used in this step.

Figure 4E:
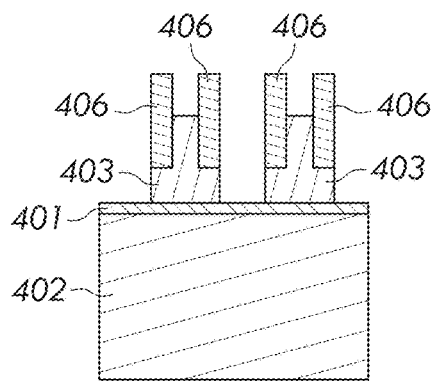

In step 307, a second level etching of template material 403 is performed using side wall spacers 406 as an etch mask as shown in FIG. 4E. In one embodiment, CHF$_3$/O$_2$ RIE chemistry is used in this step.

Figure 4F:
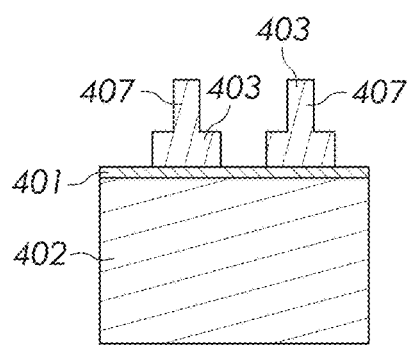

In step 308, side wall spacers 406 are removed using a piranha clean to reveal the self-aligned symmetric multi-tier silicon dioxide features 407 in template material 403 as shown in FIG. 4F. These self-aligned multi-tiered features may include a multi-tiered grating, a multi-tiered trench, a multi-tiered cylinder, a multi-tiered hole, a tube structure, a shaped multi-tiered pillar, a shaped multi-tiered hole and a shaped tubed structure. In one embodiment, the shaped structures have cross sections that may be elliptical, triangular, quadrilateral, diamond, polygonal, star shaped or serpentine as illustrated in FIG. 5.

Figure 5:
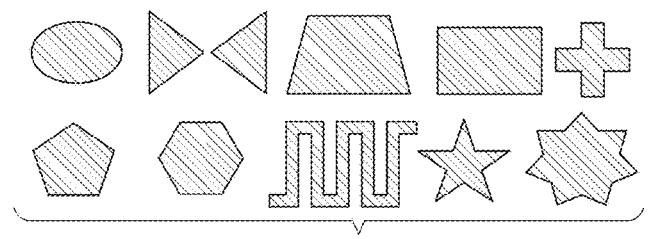
FIG. 5 illustrates exemplary nanoscale non-circular cross section shapes of interest in a variety of applications in accordance with an embodiment of the present invention.

FIG. 5 illustrates exemplary nanoscale non-circular cross section shapes of interest in a variety of applications in accordance with an embodiment of the present invention.

In a variety of nano-device applications, high-speed (low-cost) fabrication of nanostructures with sharp edges is important. This includes devices exploiting nanoscale phenomena in optics, magnetics, and biomedical materials. In the area of nanophotonics, exemplary shaped structures, such as triangular structures and elliptical structures as shown in FIG. 5, are desirable. In the area of magnetics, multi-bit magnetic random access memory can be achieved using exemplary cross-shaped structures as shown in FIG. 5. In the biomedical area, ability to make shape controlled nanoparticles is of interest in targeted diagnostics and drug delivery. The serpentine structure, as shown in FIG. 5, is of high importance in nanoelectronics and materials research.

Figure 6:
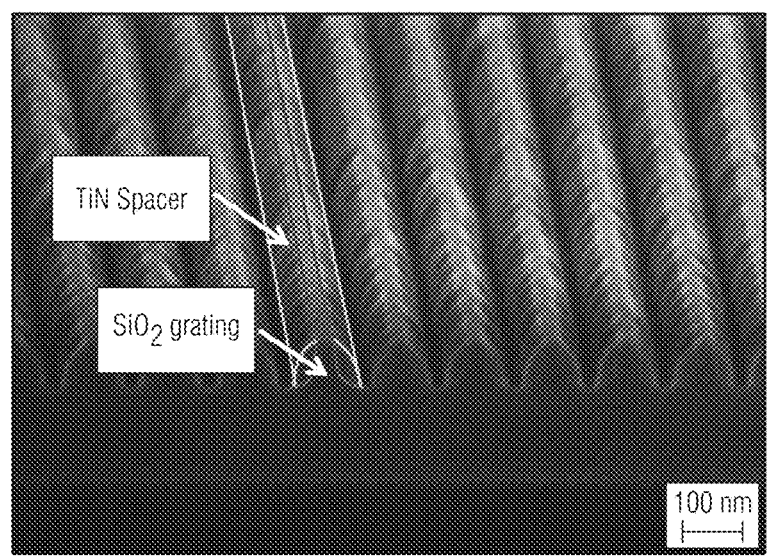
FIG. 6 is a scanning electron microscope (SEM) micrograph showing titanium nitride side wall spacers that were defined using $Ar/Cl_2$ etch chemistry in accordance with an embodiment of the present invention.

FIG. 6 is a scanning electron microscope (SEM) micrograph showing titanium nitride side wall spacers 406 that were defined using Ar/Cl$_2$ etch chemistry in accordance with an embodiment of the present invention.

Figure 7:
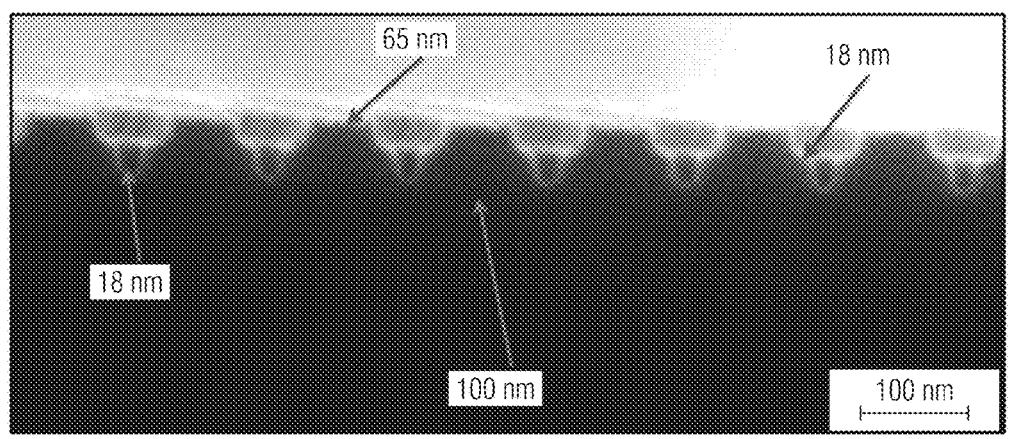
FIG. 7 is an SEM micrograph showing sub-100 nm self-aligned symmetric multi-tier structures formed using a single lithography step while completely eliminating the alignment and overlay steps in accordance with an embodiment of the present invention.

FIG. 7 is an SEM micrograph showing sub-100 nm self-aligned symmetric multi-tier structures formed using a single lithography step while completely eliminating the alignment and overlay steps in accordance with an embodiment of the present invention.

Applications of the patterning technique are described below in connection with FIGS. 8, 9A-9F, 10, 11 and 12A-12H.

Figure 8:
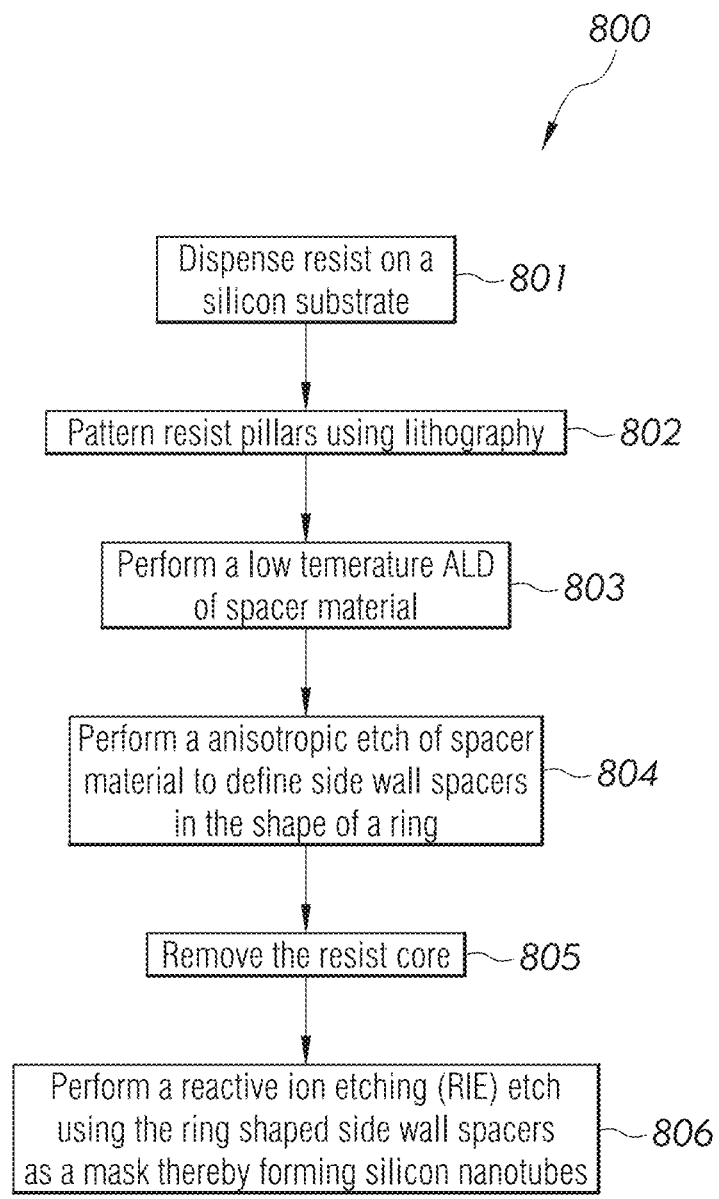
FIG. 8 is a flowchart of a method for fabricating self-aligned silicon tube structures in the nanoscale in accordance with an embodiment of the present invention.

Referring to FIG. 8, FIG. 8 is a flowchart of a method 800 for fabricating self-aligned silicon tube structures in the nanoscale in accordance with an embodiment of the present invention. FIG. 8 will be discussed in conjunction with FIGS. 9A-9F, which depict cross-sectional views of fabricating self-aligned silicon tube structures in the nanoscale using the steps described in FIG. 8 in accordance with an embodiment of the present invention.

Referring to FIG. 8, in step 801, resist 901 is dispensed on a silicon substrate 902 as shown in FIG. 9A.

In step 802, resist pillars 904 are patterned using lithography. In one embodiment, the patterning process used is nanoimprint lithography and nanoimprint template 903 is shown in FIG. 9A. The patterned resist pillars 904 and residual resist layer 905 are shown in FIG. 9B. In one embodiment, the cross-section of resist pillars 904 is non-circular (e.g., elliptical, triangular, quadrilateral, diamond, polygonal, star shaped and serpentine).

In step 803, the residual layer 905 is removed using Ar/O$_2$ RIE chemistry followed by a low temperature atomic layer deposition (ALD) of spacer material 906 (e.g., silicon dioxide) as shown in FIG. 9C. In one embodiment, the polymer resist material 901 utilized herein is stable under its glass transition temperature (T$_g$) of 150° C. This material is ideal for low temperature atomic layer deposition of a spacer material 906. In one embodiment, spacer material 906 can be silicon dioxide around the resist pillars 904. The silicon containing precursor gas used in this process is Tris(dimethylamino)silane commonly referred to as TDMAS. By alternating TDMAS with steam in the ALD chamber maintained at 110° C., uniform conformal layer of silicon dioxide is formed around the resist cores as shown in FIG. 9C.

In step 804, an anisotropic etch of spacer material 906 is performed to define side wall spacers 907 in the shape of a ring as shown in FIG. 9D. In one embodiment, this process step is carried out using CHF$_3$/Ar/CF$_4$ etch chemistry.

In step 805, the resist core 908 is removed as shown in FIG. 9E. In one embodiment, the exposed resist cores 908 are be etched in a standard wet piranha bath as illustrated in FIG. 9E.

Figure 10:
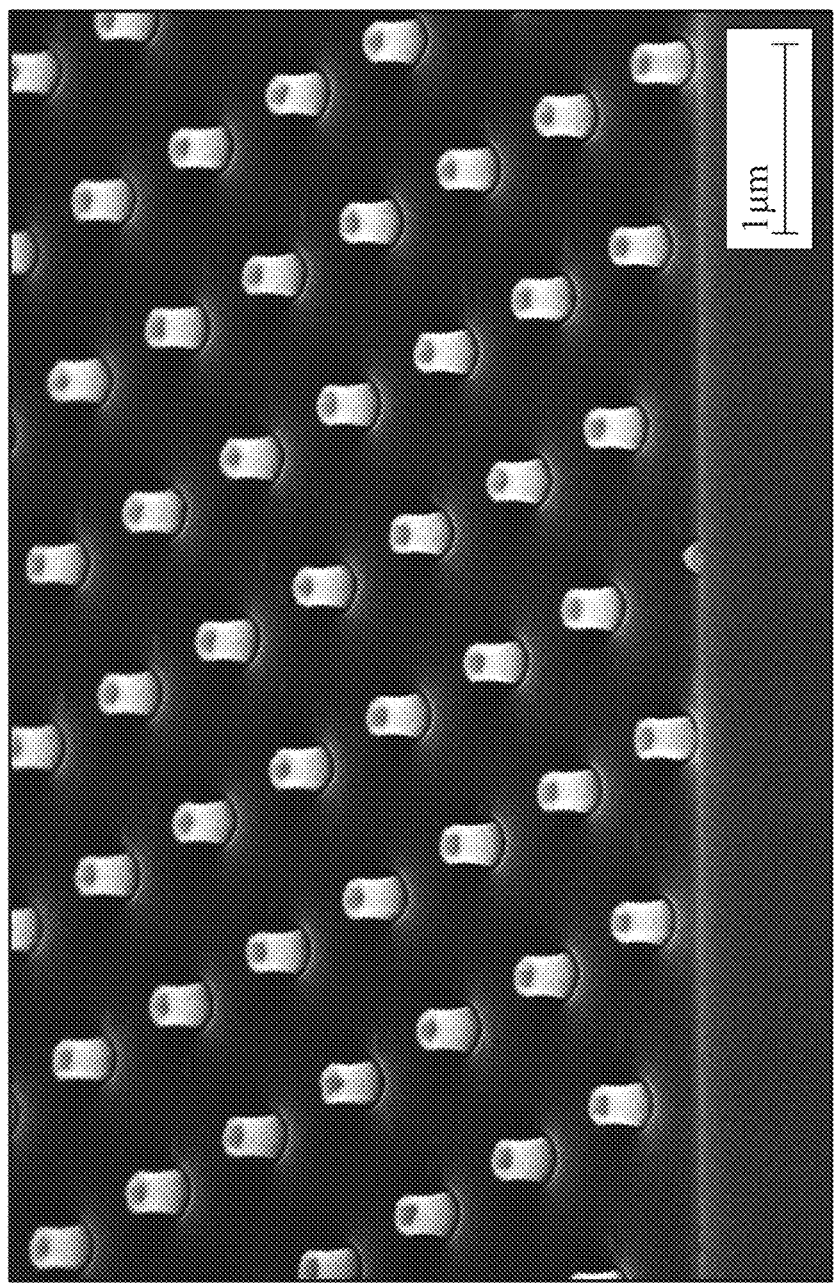
FIG. 10 is a Scanning Electron Microscope (SEM) micrograph of silicon tubes formed using method 800 in accordance with an embodiment of the present invention.

In step 806, a reactive ion etching (RIE) etch is performed using the ring shaped side wall spacers 907 as a mask thereby forming silicon nanotubes as shown in FIG. 9F. In one embodiment, the cross-section of the resulting silicon nanotubes is a non-circular shape corresponding to the non-circular cross-section shape of resist pillars 904. In one embodiment, etching of silicon 902 using the ring shaped silicon dioxide hard mask 907 is carried out using HBr/Cl$_2$ etch chemistry. After this etch, the remaining silicon dioxide mask 907 can be removed by wet etching using buffered oxide etchants. This step should expose the desired silicon tubes in the nanoscale. An SEM micrograph of silicon tubes demonstrating the use of method 800 is shown in FIG. 10 in accordance with an embodiment of the present invention.

Energy storage systems are of significant importance for applications, such as hand-held devices, tablet computers, and electric cars. Batteries and capacitors are two classes of devices that are constantly considered as primary energy sources for such applications. While batteries have high energy storage densities, they have very slow charge/discharge rates. Capacitors, on the other hand, can provide more power than batteries, but the energy storage density is lower. An intermediate class of storage devices called the ultra-capacitors combine high power and long life cycle times of capacitors with the energy storage density of batteries.

The capacitance of a parallel plate capacitor is directly proportional to the surface area of overlap between the two plates separated by a dielectric.

It was demonstrated that by increasing the surface area of individual nanowire capacitors to the unit projected area using metal assisted chemical etching (MACE), the surface area of overlap can be increased leading to increase in capacitance. Tubes have higher surface area than nanowires owing to the additional cylindrical inner surface. So the capacitance of an individual tube capacitor is higher than that of an individual nanowire capacitor of equal height. A method for fabricating such a tube capacitor is discussed below in connection with FIGS. 11 and 12A-12D.

Figure 11:
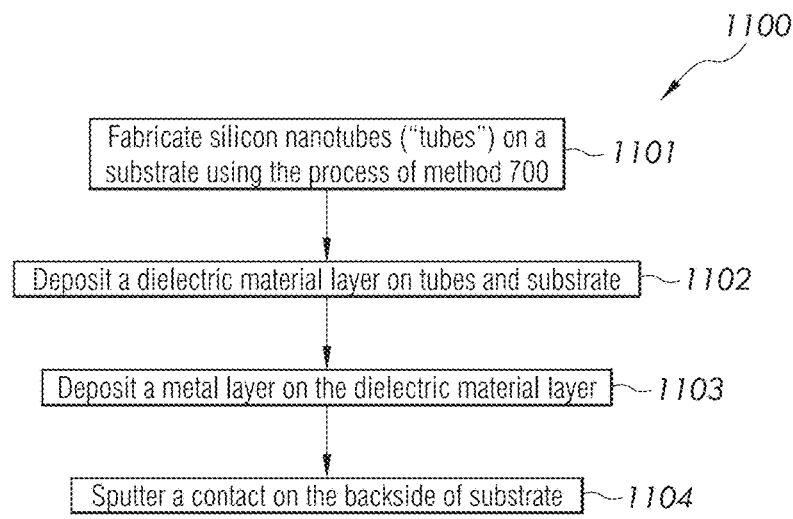
FIG. 11 is a method for fabricating a silicon tube capacitors by dry etching of silicon in accordance with an embodiment of the present invention.

FIG. 11 is a method 1100 for fabricating silicon tube capacitors by dry etching of silicon in accordance with an embodiment of the present invention. FIG. 11 will be discussed in conjunction with FIGS. 12A-12D, which depict cross-sectional views of fabricating silicon tube capacitors by dry etching of silicon using the steps described in FIG. 11 in accordance with an embodiment of the present invention.

Figures 12A, 12B:
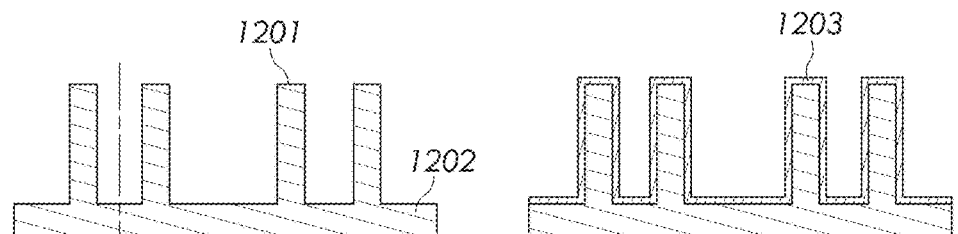
FIGS. 12A-12D depict cross-sectional views of fabricating a silicon tube capacitors by dry etching of silicon using the steps described in FIG. 11 in accordance with an embodiment of the present invention.

Referring to FIG. 11, in step 1101, silicon nanotubes or "tubes" 1201 on a substrate 1202 (e.g., silicon) are fabricated using the process of method 800 as shown in FIG. 12A.

In step 1102, a dielectric material layer 1203 (e.g., hafnium dioxide, aluminum oxide, silicon dioxide, zirconium dioxide, hafnium silicate, zirconium silicate and silicon oxynitride) is deposited (e.g., such as via atomic layer deposition (ALD), chemical vapor deposition (CVD) or sputtering) on tubes 1201 and substrate 1202 as shown in FIG. 12B.

Figures 12C, 12D:
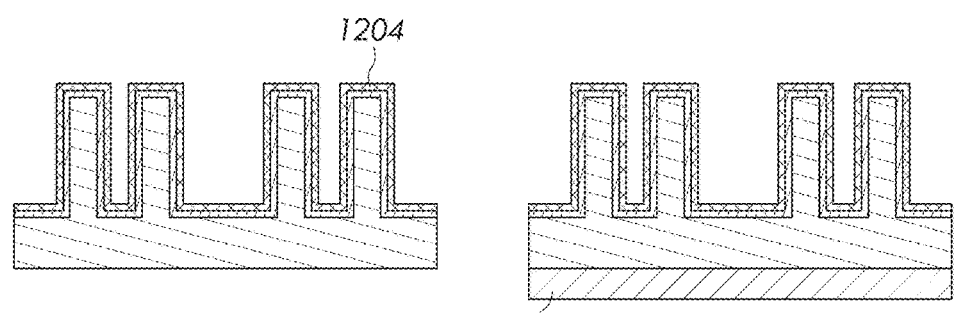

In step 1103, a metal layer 1204 (e.g., titanium nitride, tantalum nitride or nickel) is deposited (e.g., such as via atomic layer deposition (ALD), chemical vapor deposition or sputtering) on the dielectric material layer 1203 as shown in FIG. 12C.

In step 1104, a contact 1205 (e.g., aluminum) is sputtered on the backside of substrate 1202 as shown in FIG. 12D to enable performance characterization.

A more detailed description of method 1100 is provided below. In method 1100, pre-fabricated silicon nanotubes 1201 etched in silicon are introduced into an ALD chamber for deposition of dielectric material 1203. The dielectric material 1203, for instance, may be hafnium dioxide which is a high-k dielectric. In another embodiment, dielectric material 1203 is aluminum oxide, silicon dioxide, zirconium dioxide, hafnium silicate, zirconium silicate, or silicon oxynitride deposited by ALD, CVD, or sputtering. Once this is completed, conductive material 1204 to complete the metal-insulator-semiconductor (MIS) stack is deposited, preferably using ALD to enable a conformal MIS stack even along the inner walls of silicon nanotubes 1201. In one embodiment, the conductive material 1204 is titanium nitride, tantalum nitride, or nickel. A backside contact metal 1205 may then be sputtered on the underside of the wafer 1202 for characterization. In one embodiment, backside contact metal 1205 is aluminum.

An alternative method for fabricating silicon tube capacitors, such as high aspect ratio silicon tube capacitors, using metal assisted chemical etching (MACE) and deposition of conductive material and dielectric material is discussed below. MACE is a wet etch process where silicon is preferentially etched at the interface between a noble metal and the silicon surface in a solution of hydrofluoric acid (HF), Deionized ("DI") water, and an oxidant (commonly $H_2O_2$). This results in an anisotropic etch where the geometry of the features is determined by the shape of the patterned noble metal as well as the metal's mechanical stability during etch. By depositing the noble metal outside the silicon (Si) tubes on the surface of the Si substrate thus forming a metal mesh and on the Si tubes at the base, and performing MACE, high aspect ratio Si tube structures can be formed. The preferential etch mechanism is as follows: (i) the noble metal catalyzes the reduction of the oxidant creating holes, (ii) the holes are injected through the metal into the silicon where it contacts the metal, (iii) the silicon oxidizes, (iv) the HF dissolves the oxidized silicon, and (v) finally, the soluble products are removed and the metal moves into the space where the process repeats. These high aspect ratio Si nanotubes 1201 are introduced into an ALD chamber for deposition of dielectric material 1203. As discussed above in connection with method 1100, dielectric material 1203, for instance, can be hafnium dioxide which is a high-k dielectric. In another embodiment, dielectric material 1203 is aluminum oxide, silicon dioxide, zirconium dioxide, hafnium silicate, zirconium silicate, or silicon oxynitride deposited by ALD, CVD, or sputtering. Once this is completed, conductive material 1204 to complete the MIS stack is deposited, preferably using atomic layer deposition to enable a conformal MIS stack even along the inner walls of silicon nanotubes 1201. In one embodiment, conductive material 1204 is titanium nitride, tantalum nitride, or nickel. A backside contact metal 1205 can be sputtered on the underside of wafer 1202 for characterization. In one embodiment, backside contact metal 1205 is aluminum.

In another embodiment, aluminum oxide may be used as dielectric material 1203. Once this is completed, conductive material 1204 to complete the MIS stack is deposited, preferably using atomic layer deposition to enable a conformal MIS stack even along the inner walls of the silicon nanotubes 1201. Titanium nitride can be used as conductive material 1204. A backside contact metal 1205 can be sputtered on the underside of wafer 1202 for characterization.

Figure 13:
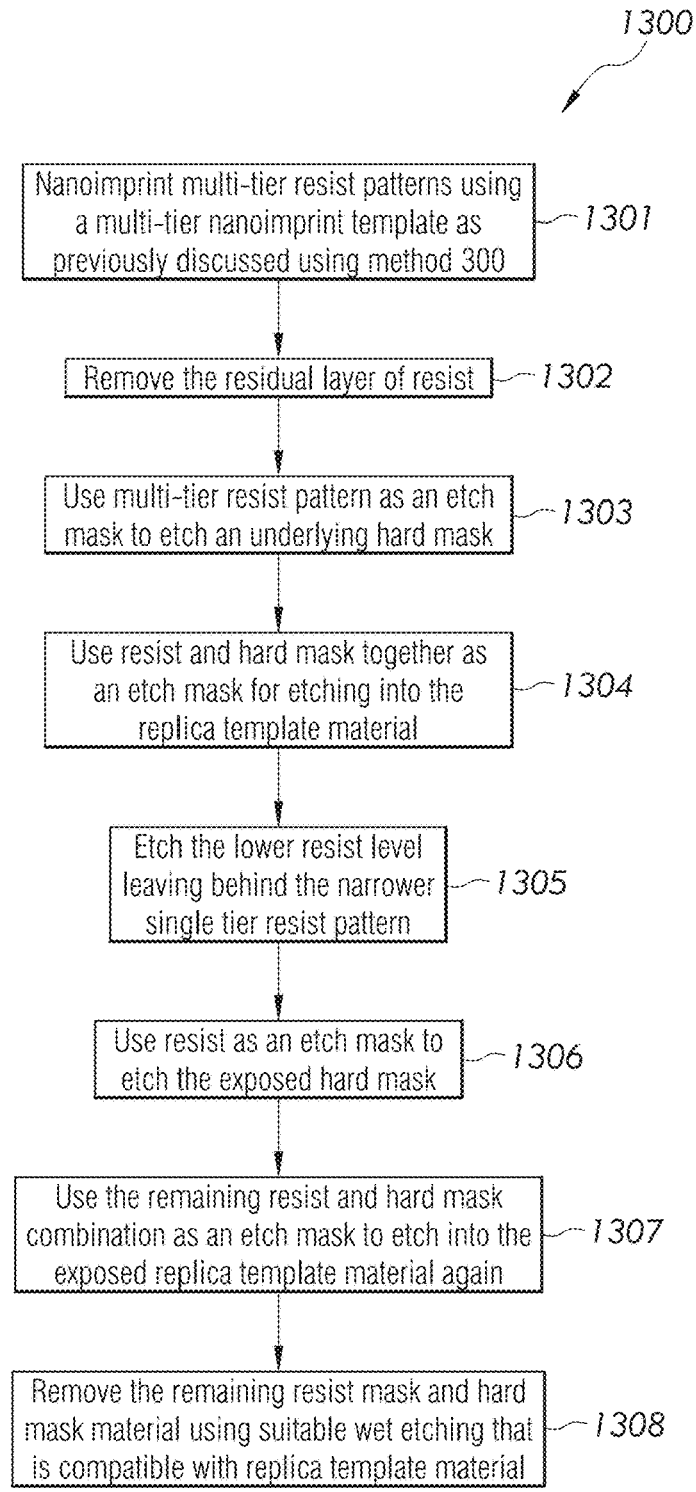
FIG. 13 is a flowchart of a method for pattern transfer of multi-tier structures into a substrate material in accordance with an embodiment of the present invention.

FIG. 13 is a flowchart of a method 1300 for pattern transfer of multi-tier structures into a substrate material in accordance with an embodiment of the present invention. FIG. 13 will be discussed in conjunction with FIGS. 14A-14H, which depict cross-sectional views of a process for pattern transfer of multi-tier structures into a substrate material using the steps described in FIG. 13 in accordance with an embodiment of the present invention.

Referring to FIG. 13, in step 1301, multi-tier resist patterns 1401 are nanoimprinted using a multi-tier nanoimprint template as previously discussed using method 300 as shown in FIG. 14A. In one embodiment, multi-tier resist patterns reside on a hard mask 1402 which resides on a replica template material 1403.

In step 1302, the residual layer of resist 1404 is removed by using $Ar/O_2$ RIE chemistry as shown in FIG. 14B.

In step 1303, the multi-tier resist pattern 1401 is used as an etch mask to etch an underlying hard mask 1402 (e.g., chromium, aluminum). In one embodiment, an RIE etch chemistry of $Cl_2/O_2$ is used in step 1303.

In step 1304, resist 1401 and hard mask 1402 together serve as an etch mask for etching into the replica template material 1403, which in one embodiment, is fused silica as shown in FIG. 14D. In one embodiment, the etch chemistry for this step is a $CF_4/Ar/CHF_3$ based one.

In step 1305, $Ar/O_2$ RIE etch chemistry is used to etch the lower resist level leaving behind the narrower single tier resist pattern 1401 as shown in FIG. 14E.

In step 1306, resist 1401 is used as an etch mask to etch the exposed hard mask 1402 using $Cl_2/O_2$ RIE chemistry as shown in FIG. 14F.

In step 1307, the remaining resist 1401 and hard mask 1402 combination is used as an etch mask to etch into the exposed replica template material 1403 again as shown in FIG. 14G. This creates the multi-tier pattern on template material 1403 as shown in FIG. 14G.

In step 1308, the remaining resist mask 1401 and hard mask 1402 material are removed using suitable wet etching that is compatible with replica template material 1403 thereby forming a multi-tier nanoimprint template as shown in FIG. 14H. In another embodiment, template material 1403 is a stack of three materials: in one embodiment, it consists of fused silica, with a sputtered etch stop layer, such as ITO or silicon nitride, and silicon dioxide on top of the etch stop, deposited using plasma enhanced chemical vapor deposition (PECVD).

Figure 15:
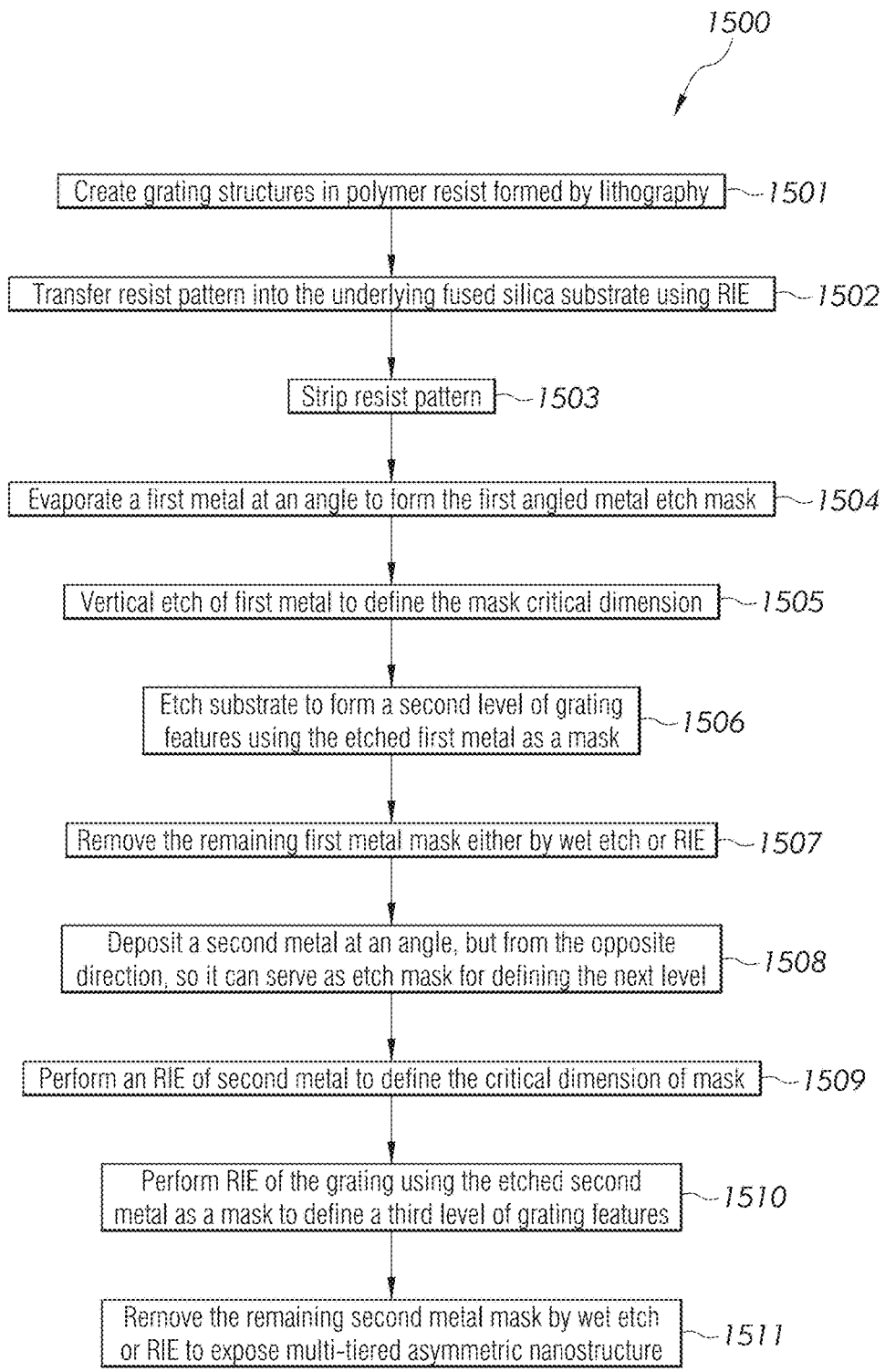
FIG. 15 is a flowchart of a method for forming multi-tier asymmetric nanostructures in accordance with an embodiment of the present invention.

With respect to fabricating multi-tier asymmetric nanostructures, the present invention describes a method to form multi-tiered asymmetric nanostructures in fused silica, which may then be used as imprint templates to replicate the structures using J-FIL on polymer resist as discussed below in connection with FIGS. 15 and 16A-16J. FIG. 15 is a flowchart of a method 1500 for forming multi-tier asymmetric nanostructures in accordance with an embodiment of the present invention. FIG. 15 will be discussed in conjunction with FIGS. 16A-16J, which depict cross-sectional views of fabricating multi-tier asymmetric nanostructures using the steps described in FIG. 15 in accordance with an embodiment of the present invention.

Referring to FIG. 15, in step 1501, grating structures 1601 are created in resist forming a resist pattern 1602 by lithography on a substrate 1603 (e.g., fused silica) shown in FIG. 16A.

In step 1502, resist pattern 1602 is transferred into the underlying fused silica substrate 1603 using RIE chemistry of $CF_4/Ar/CHF_3$ as illustrated in FIG. 16B.

In step 1503, resist pattern 1602 is stripped.

In step 1504, a first metal 1604 is evaporated at an angle to form an angled metal etch mask on the grating features (level 1) 1603 shown in FIG. 16C. In one embodiment, metal 1604 may be chromium.

In step 1505, a vertical RIE of metal 1604 is then carried out to define the critical dimension (CD) of mask 1504 as required as shown in FIG. 16D.

Figure 17:
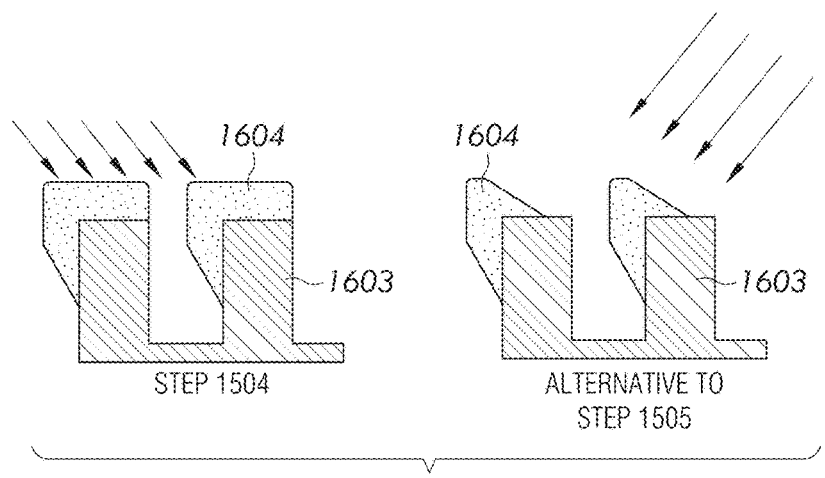
FIG. 17 illustrates an alternative to step 1504 of FIG. 15 where an angled RIE of the metal is performed from the opposite direction in accordance with an embodiment of the present invention.

In an alternative embodiment, instead of performing a vertical RIE of metal 1604, an angled RIE may be performed from the opposite direction as shown in FIG. 17.

Referring to FIG. 17, FIG. 17 illustrates an alternative to step 1504 of FIG. 15 where an angled RIE of metal 1604 is performed from the opposite direction in accordance with an embodiment of the present invention.

Figure 18:
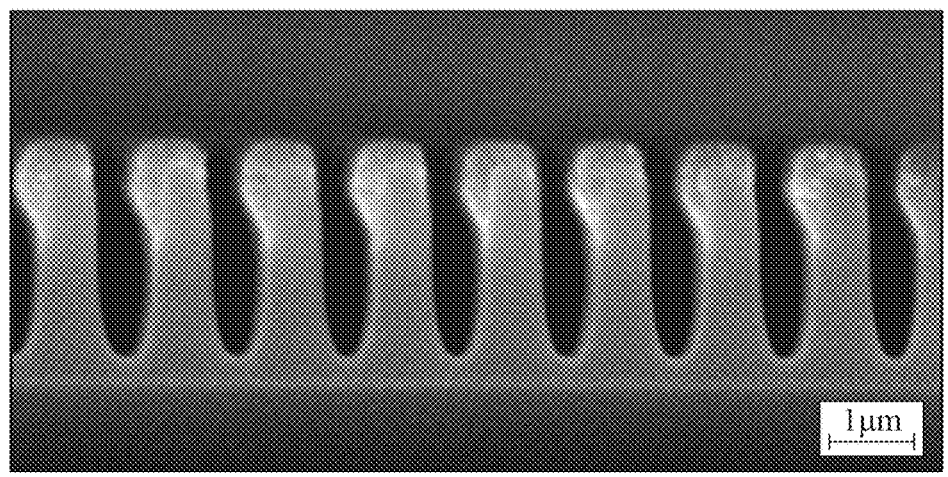
FIG. 18 is an SEM micrograph illustrating that the thickness of the angled mask at the two edges of the gratings, though different, is not significant, in accordance with an embodiment of the present invention.

As illustrated in FIG. 17, in step 1504, a metal 1604 is evaporated at a glancing angle or shadowing angle onto the grating features (level 1). In one instance, metal 1604 may be chromium. In the alternative to step 1505 of FIG. 15 discussed above, an angled RIE etching of the metal mask 1604 is performed. The direction of the RIE etch is opposite to the direction of the metal deposition in step 1504. This angled etching technique forms an angled etch progression front, which enables easier formation of the targeted CD for the angled metal mask as opposed to the vertical RIE from the top. This is important, since the difference in thickness of the angled mask at the two edges of the gratings is not significant, as shown in the SEM micrograph of FIG. 18 in accordance with an embodiment of the present invention. The angled etching process helps exaggerate this difference in thickness between the two edges of the gratings by forming an angled etch progression front, thus offering better control of metal mask CD definition. In the embodiment where chromium is used as the metal mask 1604, the RIE etch chemistry is $Cl_2/O_2$ for the angled etch step. Using the etched metal as a mask, the RIE of fused silica is done to form level 2 as shown in step 1506 of FIG. 15 as discussed below.

Returning to FIG. 15, in step 1506, using the etched metal 1604 as mask, the RIE of substrate 1603 (e.g., fused silica) is done to form a second level of grating structures 1605 as shown in FIG. 16E.

In step 1507, the remaining metal mask 1604 can be removed either by wet etch or RIE as shown in FIG. 16F.

In step 1508, a second metal 1606 (e.g., aluminum, chromium) is deposited at an angle, but from the opposite direction compared to the first angled metal deposition, so it can serve as etch mask for defining the next level as shown in FIG. 16G. In one embodiment, second metal 1606 is deposited via electron beam evaporation or sputtering.

In step 1509, an RIE of second metal 1606 is performed to define the critical dimension of mask as shown in FIG. 16H. In one embodiment, the second metal 1606 is a different type of metal than the first metal 1604. In another embodiment, the second metal 1606 is the same type of metal as the first metal 1604.

In step 1510, the etched metal 1606 serves as a mask and an RIE of the grating is done as shown to define a third level of grating features 1607 as shown in FIG. 16I. In one embodiment, the etch time can be controlled to form level 3 at the desired depth, that can be different from the depth of level 2. In one embodiment, instead of implementing a vertical RIE etch, an angle RIE etch could be performed to define the critical dimension of metal mask 1606.

Figure 19:
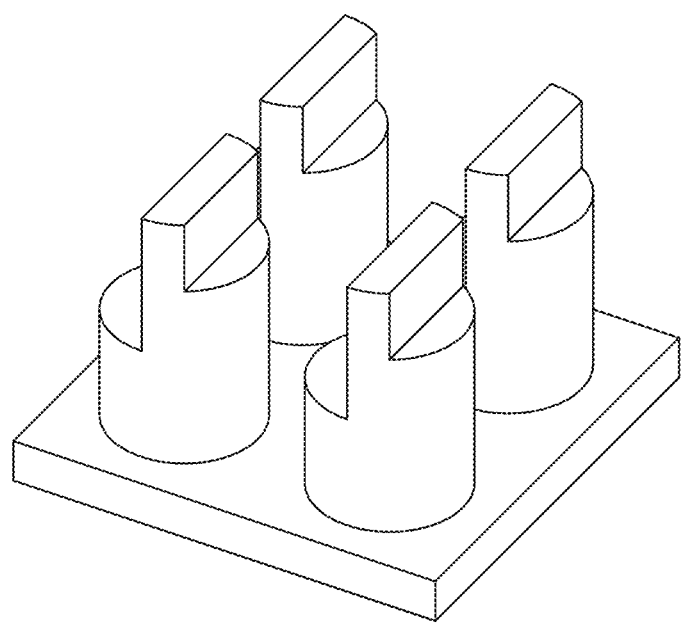
FIG. 19 illustrates multi-tier asymmetric nanopillars enabled by the present invention.

In step 1511, the remaining metal mask 1606 is them removed by wet etch or RIE to expose multi-tier asymmetric nanostructures 1608 as shown in FIG. 16J. In one embodiment, method 1500 can be carried out on pillar structures instead of grating patterns to form structures illustrated in FIG. 19 that could have interesting nanophotonic applications. FIG. 19 illustrates multi-tier asymmetric nanopillars enabled by the present invention.

Polarizers are optical filters that can manipulate the polarization of light. A potential application of the asymmetric multitier nanostructures described herein are wire grid polarizers (WGPs). WGPs are key devices that enable nanophotonic applications, such as polarizing beam splitters, filters for infrared (IR) sensors, liquid crystal display (LCD) projectors, heads-up display in automobiles, head mounted displays, and lenses for polarized sunglasses. It has been shown that geometric parameters, such as grating pitch, duty cycle, and metal aspect ratio/thickness affect transmission and contrast ratio (ER) of a WGP. The performance of wire grid polarizers can be quantified using two parameters—contrast ratio (also referred to as the "extinction ratio") and percentage transmission. Contrast ratio is defined as the ratio of optical power transmitted in the s-polarization versus the p-polarization. It is an indicator of the maximum contrast achievable using the polarizer. Percentage transmission is defined as the percentage optical power transmitted when light with equal parts s and p polarization is incident on the polarizer. Ideally perfect transmission with high contrast ratio is desired. Unfortunately, wire grid polarizers block the s-polarization while transmitting p-polarization. This limits maximum transmission to 50%. Additionally, contrast ratio and percent transmission for standard WGPs are not completely uncoupled quantities. Improving contrast ratio leads to a decrease in the percent transmission and vice-versa. Thus, there is a need for achieving high contrast as well as transmission.

In one embodiment, computational techniques, such as finite difference time-domain (FDTD), are used to evaluate the performance of WGPs with multitier cross section geometries. If the performance is not exceptional, the geometry is optimized using a genetic algorithm based optimization scheme, and the optimized geometry is evaluated using FDTD.

In one embodiment, the sequence of steps used to evaluate the performance of a given geometry for WGPs are as follows:

1. Modeling the geometry: includes specifying model extents and materials.
2. Setting up FDTD simulation region: includes specifying simulation time, spatial extent, mesh settings, and boundary conditions.
3. Refining the mesh in areas with high index change.
4. Defining electromagnetic source (in this case, a plane wave propagating perpendicular to the WGP): includes specifying the amplitude, phase, polarization, spatial extent, and frequency domain characteristics.
5. Defining monitors for recording of simulation data: includes specifying the wavelength at which data is recorded.

In one embodiment, these steps can be automated using scripting capabilities of the software. Contrast ratio and percent transmission can be extracted from monitor data also using scripts. While this computational technique can be used to evaluate a given geometry, an inverse design/optimization is used to arrive at the specific dimensions that give the best performance for each design.

Figure 20:
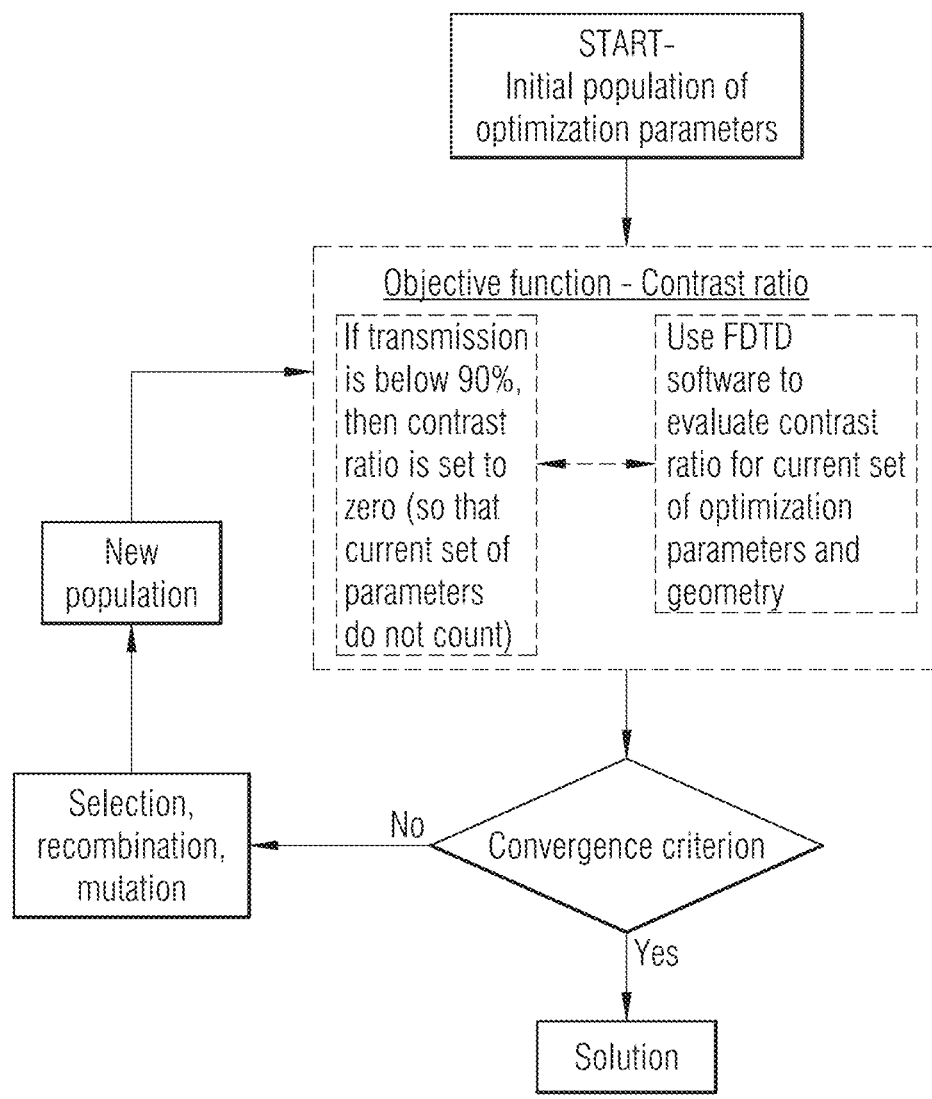
FIG. 20 illustrates a schematic of a genetic algorithm based optimization technique for optimizing WGP geometry in accordance with an embodiment of the present invention.

In one embodiment, a genetic algorithm (GA) optimization technique is used to perform the optimization as illustrated in FIG. 20. FIG. 20 illustrates a schematic of a genetic algorithm based optimization technique for optimizing WGP geometry in accordance with an embodiment of the present invention.

Referring to FIG. 20, the output of this exercise is the geometric dimensions of the optimal WGP cross sectional profile: height of the glass grating, width of the glass grating, height of the asymmetric level, width of the asymmetric level, height of the metal grating, and width of metal grating.

Figure 21:
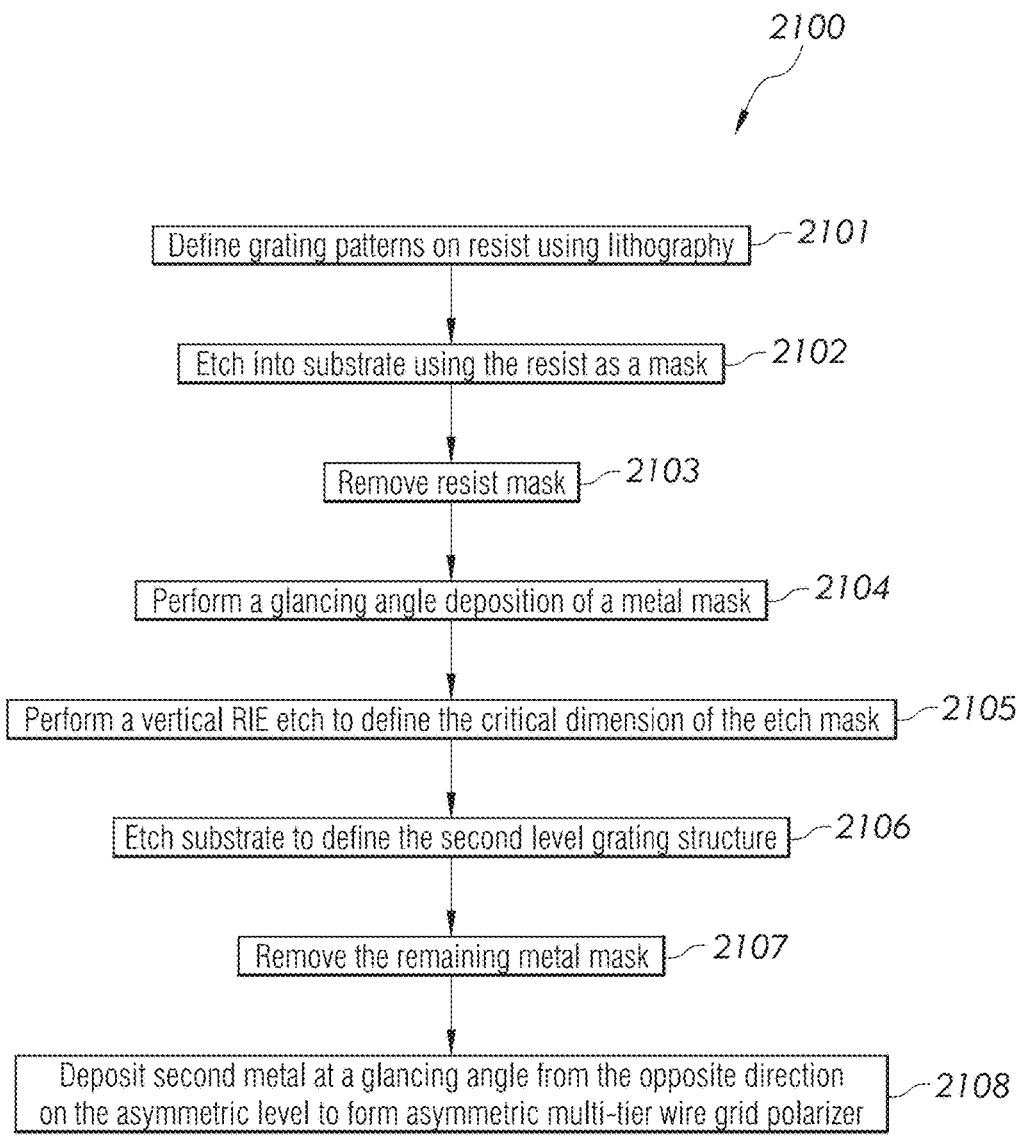
FIG. 21 is a flowchart of a method for forming asymmetric multi-tier wire grid polarizers in accordance with an embodiment of the present invention.

The fabrication process for one such asymmetric multitier wire grid polarizer is discussed below in connection with FIGS. 21 and 22A-22G. FIG. 21 is a flowchart of a method 2100 for forming asymmetric multi-tier wire grid polarizers in accordance with an embodiment of the present invention. FIG. 21 will be discussed in conjunction with FIGS. 22A-22G, which depict cross-sectional views of forming asymmetric multi-tier wire grid polarizers using the steps described in FIG. 21 in accordance with an embodiment of the present invention.

Referring to FIG. 21, in step 2101, grating patterns are defined on resist 2201 using lithography as shown in FIG. 22A. As further illustrated in FIG. 22A, resist 2201 is formed directly on substrate (e.g., fused silica) 2202. In one embodiment, the lithography process is nanoimprint, electron beam lithography, or photolithography. When nanoimprint lithography is used, the residual resist layer is removed using Ar/O$_2$ RIE chemistry.

In step 2102, the remaining resist 2201 is used as a mask to etch into substrate 2202 by performing a reactive ion etch (RIE) process as shown in FIG. 22B.

In step 2103, the resist mask 2201 and organic impurities are removed by performing a piranha clean (H$_2$O$_2$+H$_2$SO$_4$).

In step 2104, a glancing angle deposition of a metal mask 2203 (e.g., chromium) is performed as shown in FIG. 22C.

Once metal mask 2203 is deposited at a glancing angle, a vertical RIE etch is carried out to define the critical dimension of the etch mask in step 2105 as shown in FIG. 22D. In one embodiment, instead of a vertical RIE step, an angled RIE etch from the direction opposite to that of metal deposition can also be done to define mask critical dimension. In one embodiment, Cl$_2$/O$_2$ RIE chemistry is used for this process.

In step 2106, once the CD of metal mask 2203 is defined, the fused silica 2202 is etched to define the second level grating structure as shown in FIG. 22E.

In step 2107, the remaining metal mask 2603 is removed, such as by wet processing, as shown in FIG. 22F.

In step 2108, metal 2204 that forms the wire grid polarizer is deposited on the two steps of fused silica 2202 as shown in FIG. 22G. In one embodiment, aluminum is used as the WGP metal. In one embodiment, aluminum is deposited by a glancing angle deposition (GLAD) from the opposite direction as illustrated in FIG. 22G. In one embodiment, metal 2204 is deposited via electron beam evaporation or sputtering.

With respect to fabrication of a MOSFET nanoelectronic device, three different methods are discussed below to fabricate a MOSFET nanoelectronic device using the principles of the present invention. The first method shows the forming of a simple self-aligned NMOS MOSFET array using a single multi-tier imprint patterning step. As channel length scales down, short channel effects dominate in planar MOSFETs and this is addressed in practice by forming lightly doped source/drain (LDD) regions near the silicon surface and having heavier doping of the source/drain regions limited to greater depths. The second method described herein shows the forming of a self-aligned NMOS MOSFET array with LDD that is practical for short channel devices thus enabling CMOS scaling. The third method explains the fabrication of a CMOS MOSFET array using the above two methods in conjunction with photolithography.

Figure 23:
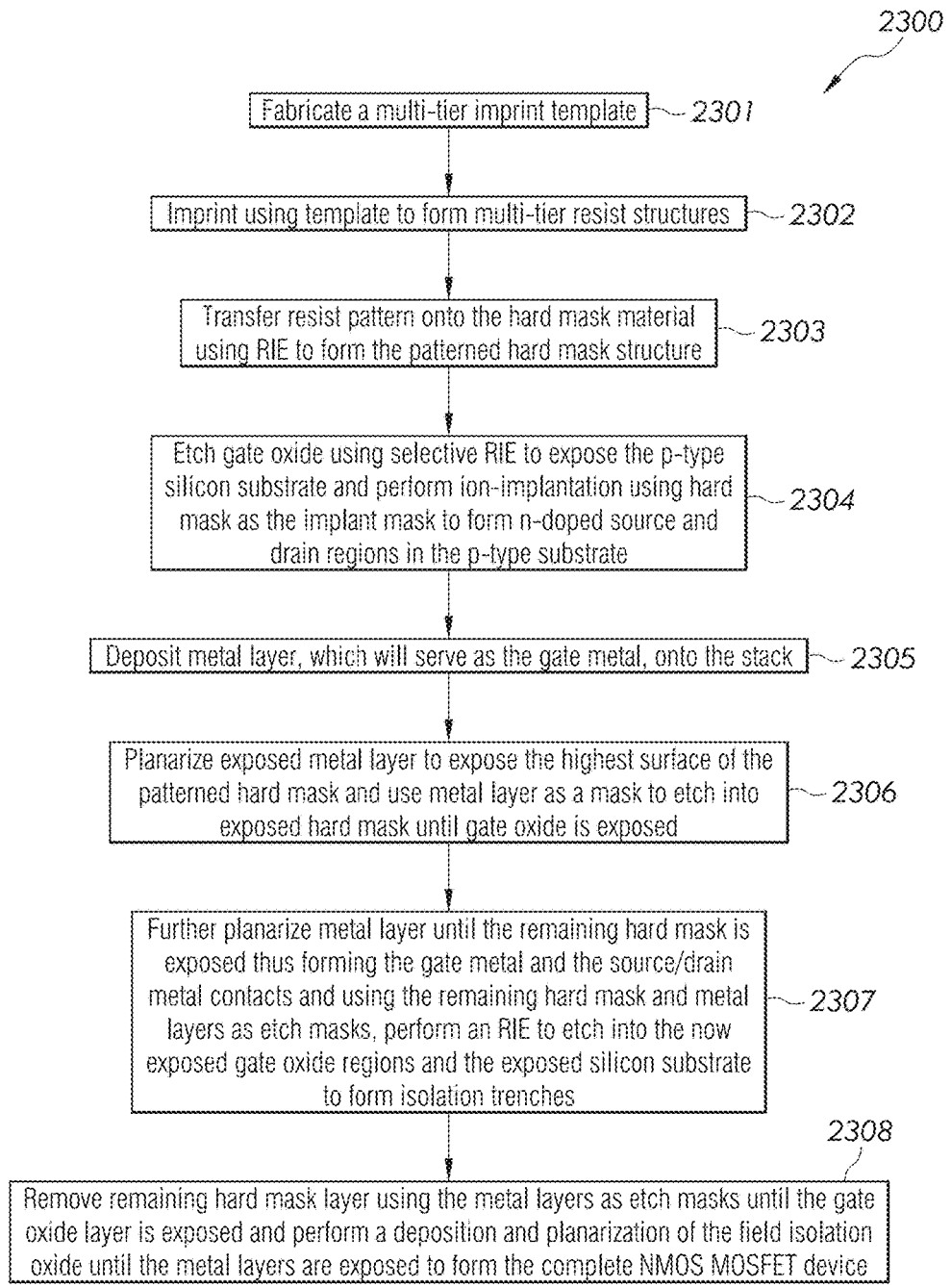
FIG. 23 is a flowchart of a method for fabricating a completed NMOS MOSFET array by imprinting with self-aligned multi-tier nanoimprint templates in accordance with an embodiment of the present invention.

An embodiment of forming an exemplary self-aligned sample NMOS MOSFET array is discussed below in connection with FIGS. 23 and 24A-24H. The exemplary device chosen to show the capability of this process is a self-aligned coplanar metal-gate NMOS MOSFET device. FIG. 23 is a flowchart of a method 2300 for fabricating a completed NMOS MOSFET array by imprinting with self-aligned multi-tier nanoimprint templates in accordance with an embodiment of the present invention. FIG. 23 will be discussed in conjunction with FIGS. 24A-24H, which depict cross-sectional views of fabricating a completed NMOS MOSFET array by imprinting with self-aligned multi-tier nanoimprint templates using the steps described in FIG. 23 in accordance with an embodiment of the present invention.

Figure 24A:
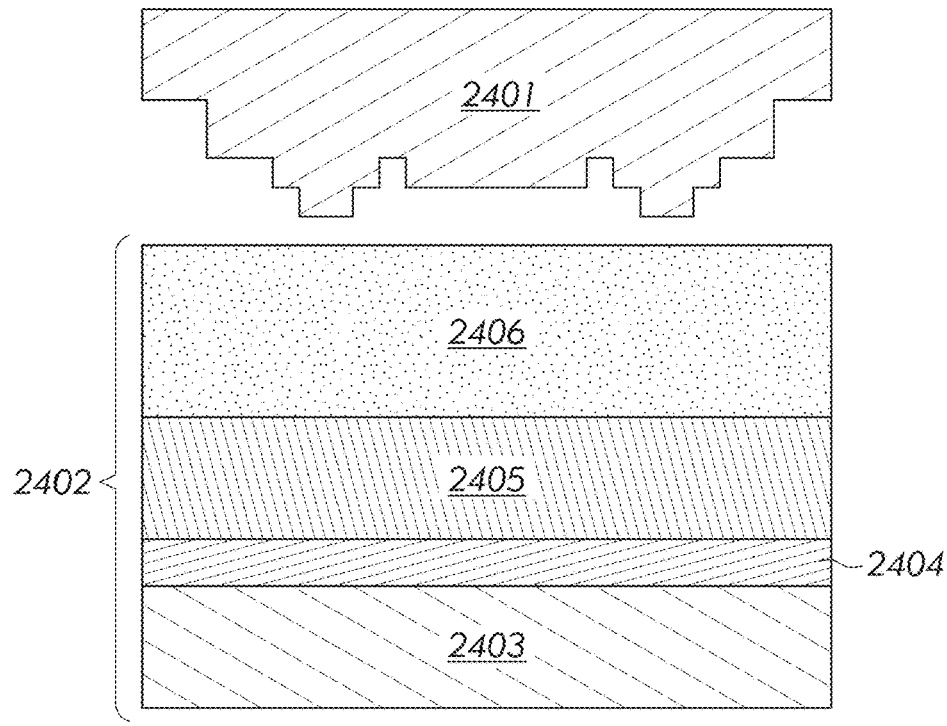
FIGS. 24A-24H depict cross-sectional views of fabricating a completed NMOS MOSFET array by imprinting with self-aligned multi-tier nanoimprint templates using the steps described in FIG. 23 in accordance with an embodiment of the present invention.

Referring to FIG. 23, in step 2301, a multi-tier imprint template 2401 is fabricated as discussed above (as well as the one created in method 3000 as discussed further below). In one embodiment, template 2401 will be imprinted onto a material stack 2402 as shown in FIG. 24A. In one embodiment, material stack 2402 includes a substrate 2403 (e.g., p-type silicon) required to form the NMOS device; a thin gate oxide layer 2404 formed directly on substrate 2403; a thick hard mask layer 2405 formed directly on gate oxide layer 2404; and the polymer imprint resist 2406 deposited on hard mask layer 2405 using the drop-on-demand technology of J-FIL.

Figure 24B:
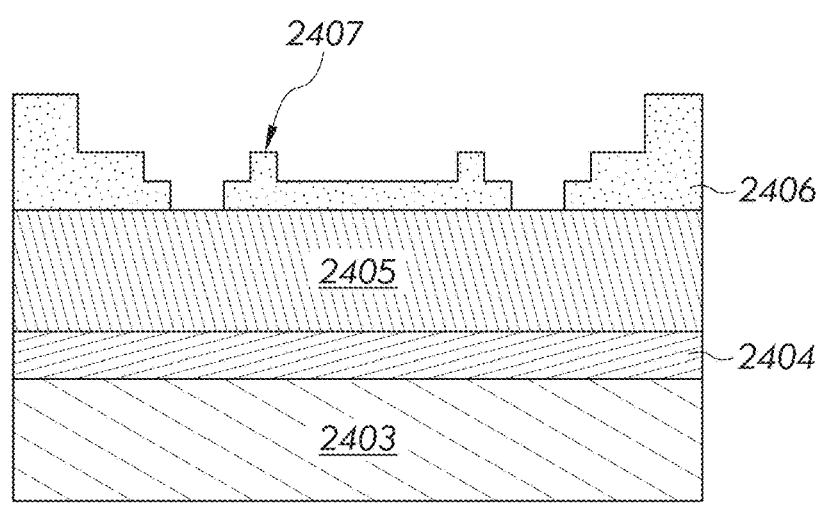

In step 2302, resist layer 2406 is imprinted with template 2401. The residual resist layer is etched and the resulting resist structure 2407 is obtained as shown in FIG. 24B.

Figure 24C:
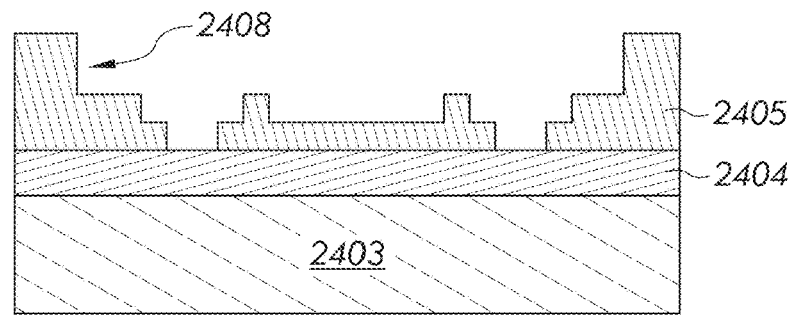

In step 2303, the resist pattern 2407 is transferred onto the hard mask material 2405 using RIE to form the patterned hard mask structure 2408 as shown in FIG. 24C.

Figure 24D:
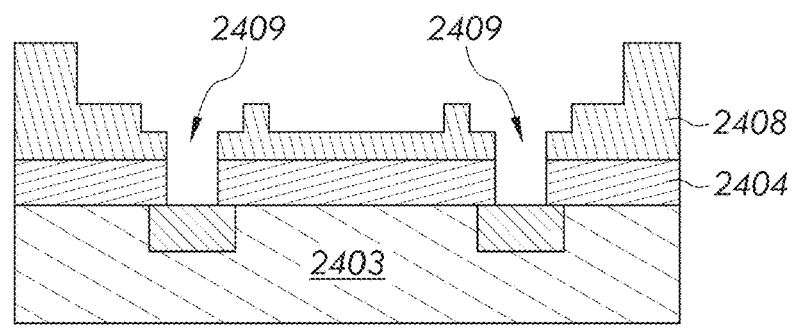

In step 2304, gate oxide 2404 is etched using selective RIE to expose the p-type silicon substrate 2403. Ion-implantation is then carried out using hard mask 2408 as the implant mask to form n-doped source and drain regions 2409 in the p-type substrate 2403 as shown in FIG. 24D.

Figure 24E:
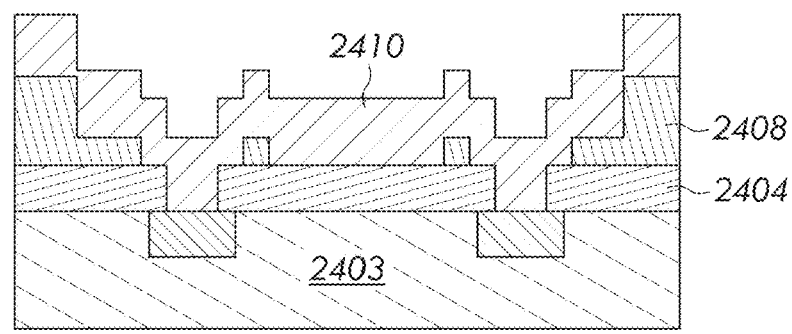

In step 2305, a metal layer 2410 which will serve as the gate metal is deposited onto the stack as shown in FIG. 24E.

Figure 24F:
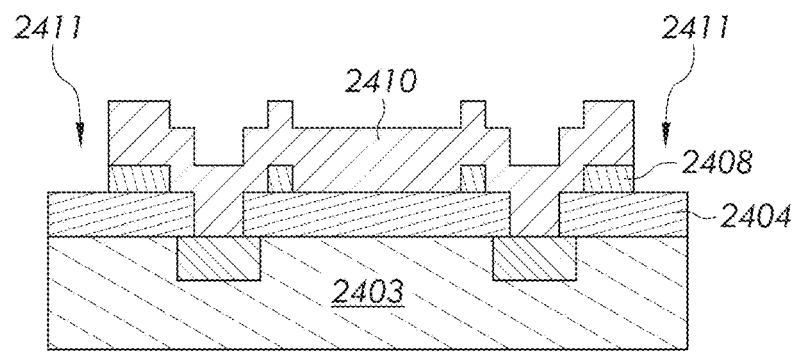

In step 2306, metal layer 2410 is planarized using chemical mechanical polishing (CMP), to expose the highest surface of the patterned hard mask 2408. Furthermore, metal layer 2410 is used as a mask to etch into exposed hard mask 2408 until gate oxide 2404 is exposed (gate oxide regions 2411) as shown in FIG. 24F.

Figure 24G:
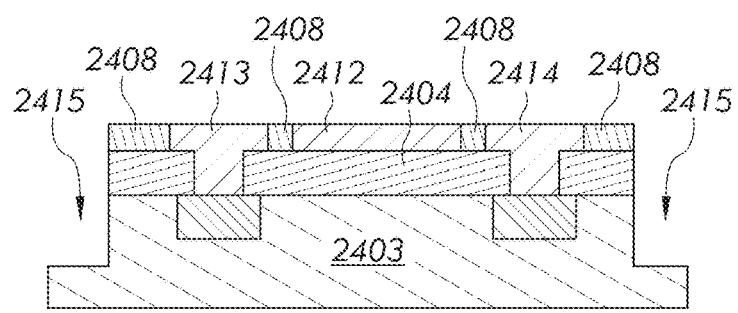

In step 2307, metal layer 2410 is further planarized using chemical mechanical polishing (CMP), until the remaining hard mask 2408 is exposed thus forming the gate metal 2412 and the source/drain metal contacts 2413, 2414 as shown in FIG. 24G. Furthermore, using the remaining hard mask 2408 and metal layers 2412, 2413, 2414 as etch masks, an RIE is performed to etch into the now exposed gate oxide regions 2411 and the exposed silicon substrate 2403 to form isolation trenches 2415 as shown in FIG. 24G.

Figure 24H:
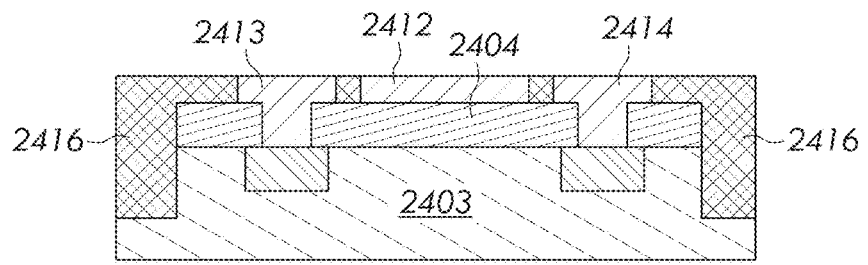

In step 2308, the remaining hard mask layer 2408 is removed using the metal layers 2412, 2413, 2414 as etch masks until the gate oxide layer 2404 is exposed. Furthermore, a deposition and planarization (e.g., CMP) of the field isolation oxide 2416 is performed until the metal layers 2412, 2413, 2414 are exposed to form the complete NMOS MOSFET device as shown in FIG. 24H.

Figure 25A:
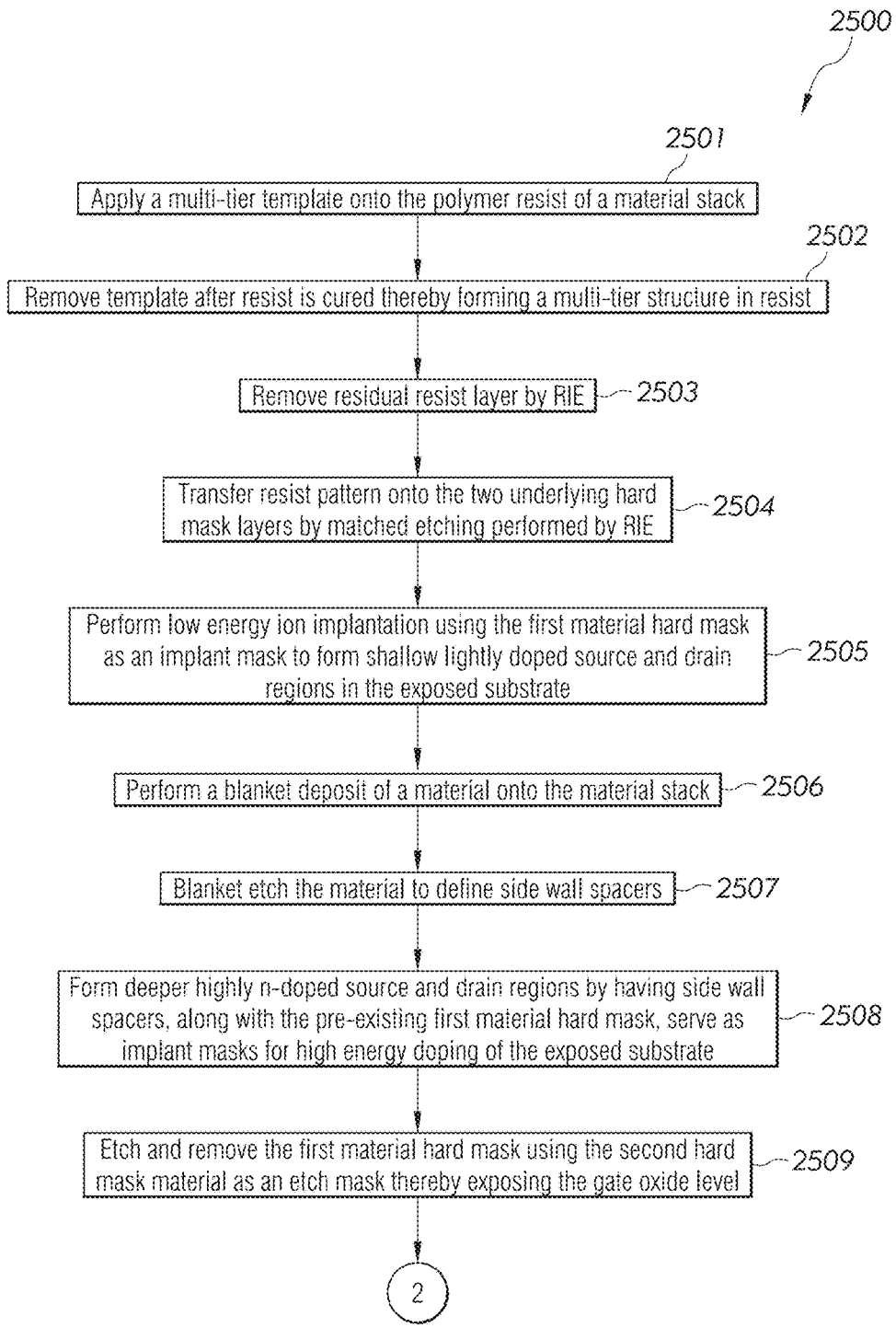
FIGS. 25A-25B are a flowchart of a method for forming an exemplary self-aligned NMOS MOSFET array with lightly doped source/drain regions suitable for short channel devices in accordance with an embodiment of the present invention.
Figure 25B:
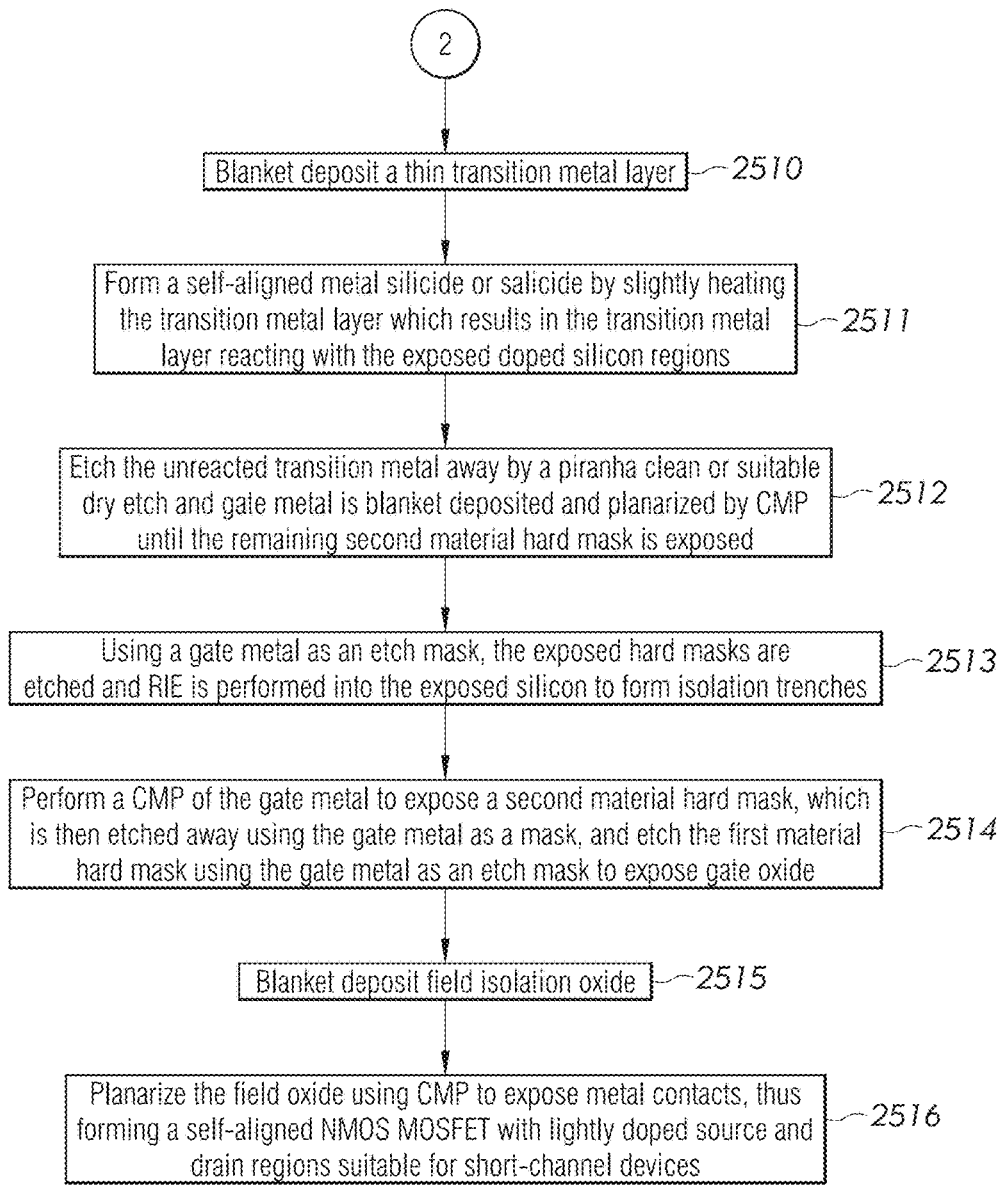

The following now discusses forming an exemplary self-aligned NMOS MOSFET with lightly doped source/drain regions suitable for short channel devices. FIGS. 25A-25B are a flowchart of a method 2500 for forming an exemplary self-aligned NMOS MOSFET array with lightly doped source/drain regions suitable for short channel devices. FIGS. 25A-25B will be discussed in conjunction with FIGS. 26A-26P, which depict cross-sectional views of forming an exemplary self-aligned NMOS MOSFET array with lightly doped source/drain regions suitable for short channel devices using the steps described in FIGS. 25A-5B in accordance with an embodiment of the present invention.

Figure 26A:
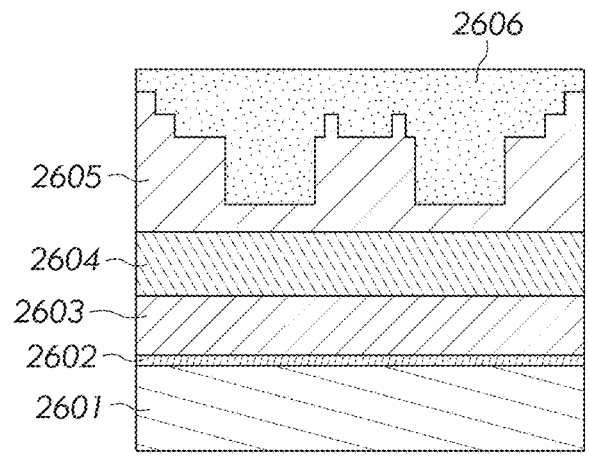
FIGS. 26A-26P depict cross-sectional views of forming an exemplary self-aligned NMOS MOSFET array with lightly doped source/drain regions suitable for short channel devices using the steps described in FIGS. 25A-25B in accordance with an embodiment of the present invention.

Referring to FIG. 25A, in step 2501, a multi-tier template 2606 (such as the one created in method 3000 as discussed further below) is applied onto the polymer resist 2605 of a material stack including, in one embodiment, a p-type silicon substrate 2601, a thin high-k dielectric gate oxide layer 2602 formed directly on top of substrate 2601, a first hard mask material 2603, which may be a nitride or an oxide, formed directly on top of high-k dielectric gate oxide layer 2602, a second hard mask material 2604, which may be an oxide or a nitride (different from the first hard mask material) formed directly on top of the first hard mask material 2603, and the polymer sacrificial resist 2605 formed directly on top of the second hard mask material 2604 as shown in FIG. 26A.

Figure 26B:
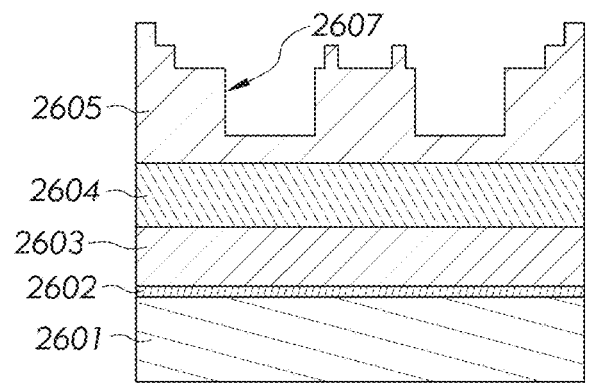

In step 2502, template 2606 is removed after resist 2605 is cured forming a multi-tier structure 2607 in resist 2605 as shown in FIG. 26B.

Figure 26C:
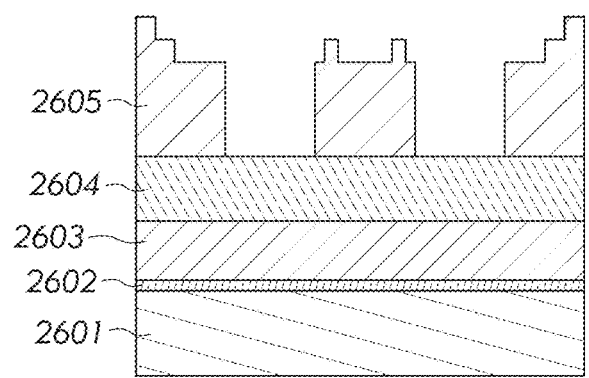

In step 2503, the residual resist layer of the resist 2605 is removed by RIE as shown in FIG. 26C.

Figure 26D:
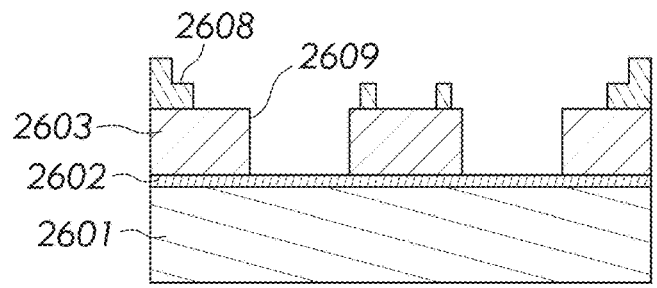

In step 2504, resist pattern 2607 is transferred onto the two underlying hard mask layers 2603, 2604 by matched etching performed by RIE. The first two levels from the top in the patterned resist 2607 are transferred onto layer 2604 (and now becomes 2608) and the third level from patterned resist 2607 is transferred onto 2603 (and now becomes 2609). This matched etching can be carried out by alternately etching the resist 2607 and hard masks 2603, 2604 transferring one feature layer at a time. The result of this etch is shown in FIG. 26D.

Figure 26E:
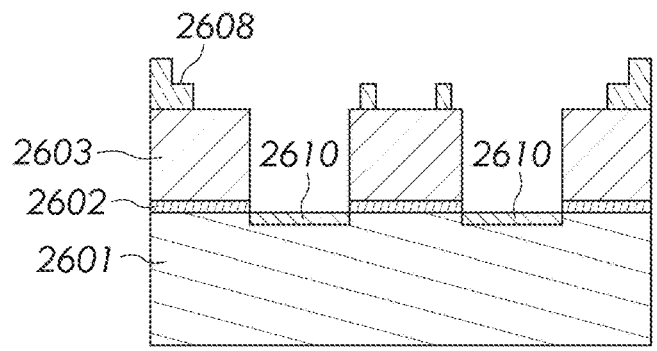

In step 2505, using hard mask 2609 as an implant mask, low energy ion implantation is carried out to form shallow lightly doped source and drain regions 2610 in the exposed substrate 2601 as shown in FIG. 26E.

Figure 26F:
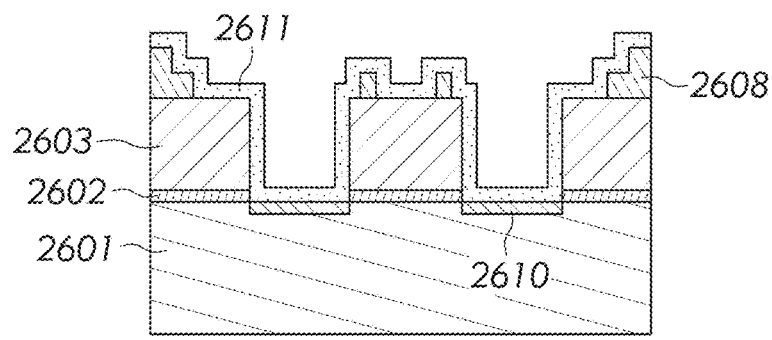

In step 2506, a thin layer of material 2611, which in one embodiment is the same as hard mask material 2603, is blanket deposited onto the material stack as shown in FIG. 26F.

Figure 26G:
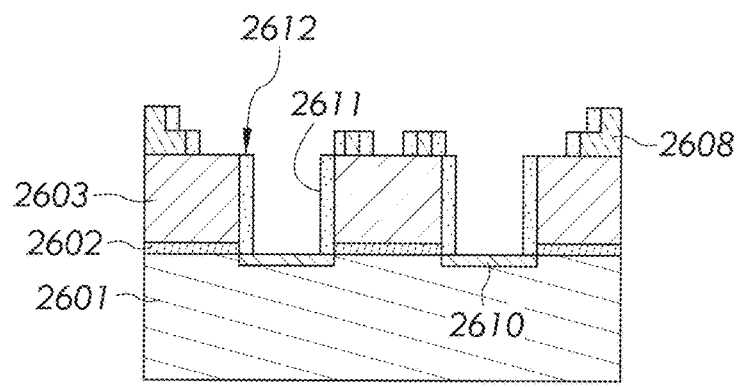

In step 2507, material 2611 is then blanket etched to defined side wall spacers 2612 as shown in FIG. 26G.

Figure 26H:
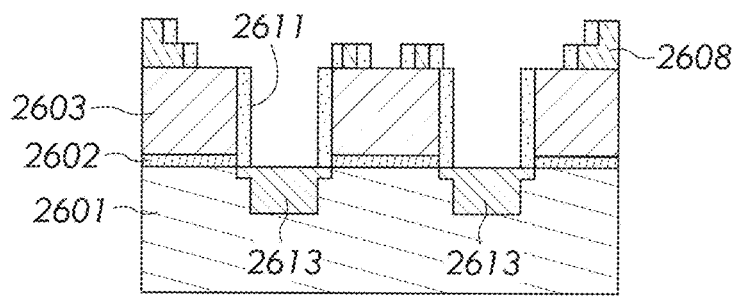

In step 2508, side wall spacers 2612, along with the pre-existing hard mask material 2609, serve as implant masks for high energy doping of exposed substrate 2601 to form deeper highly n-doped source and drain regions 2613 as shown in FIG. 26H.

Figure 26I:
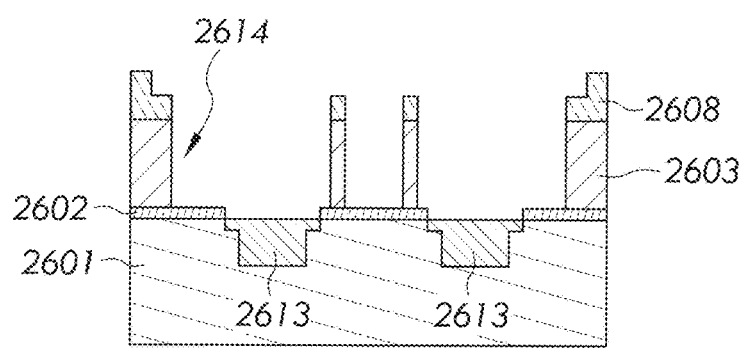

In step 2509, using hard mask material 2608 as an etch mask, hard mask material 2609 (2609 and 2612, in one embodiment, are the same material) is etched and removed and defines the remaining hard mask 2614 as shown in FIG. 26I.

Figure 26J:
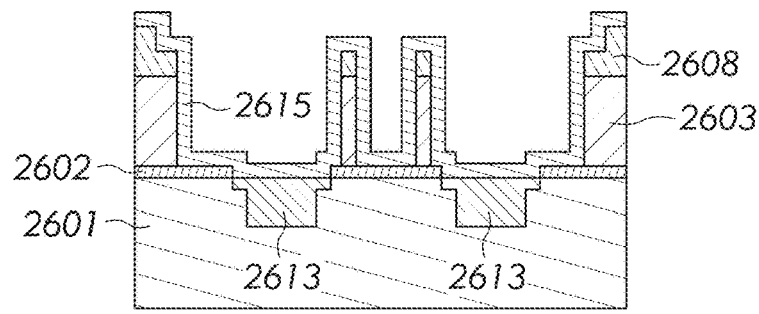

Referring to FIG. 25B, in step 2510, a thin transition metal layer 2615 is blanket deposited onto the material stack as shown in FIG. 26J. In one embodiment, layer 2615 is titanium.

Figure 26K:
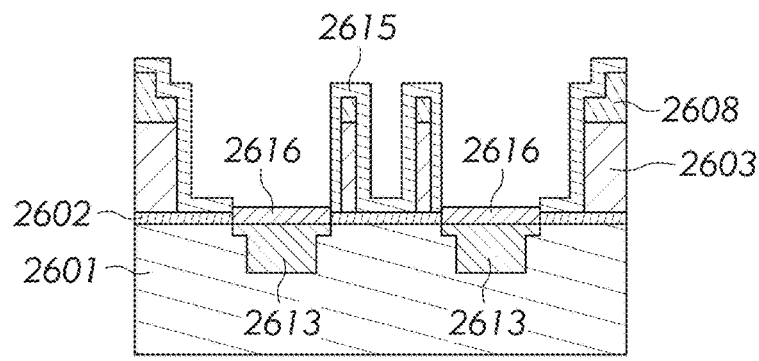

In step 2511, on slight heating, transition metal layer 2615 reacts with the exposed doped silicon regions 2610 to form transition metal silicide 2616 which is a low resistance contact as shown in FIG. 26K. In one embodiment, transition metal layer 2615 does not react with the exposed hard mask layers 2608 and 2614 or with expose gate oxide 2602 and reacts only with exposed silicon 2610 thereby forming a self-aligned metal silicide or salicide 2616 as shown in FIG. 26K.

Figure 26L:
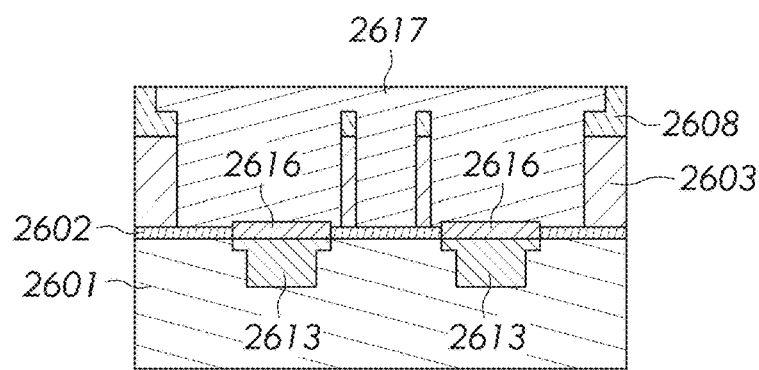

In step 2512, the unreacted transition metal is etched away by a piranha clean or suitable dry etch and gate metal 2617 is blanket deposited and planarized by CMP until remaining hard mask 2608 is exposed as shown in FIG. 26L.

Figure 26M:
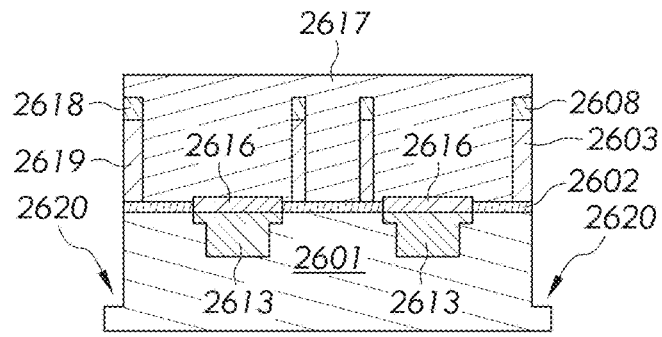

In step 2513, using gate metal 2617 as an etch mask, exposed hard masks 2608 and 2614 are etched (in that order) and the remaining second material hard mask 2608 becomes 2618 and the remaining first material hard mask 2609 becomes 2619 as shown in FIG. 26M. Continuing to use gate metal 2617 as an etch mask, RIE is done into exposed silicon 2610 to form isolation trenches 2620 as shown in FIG. 26M.

Figure 26N:
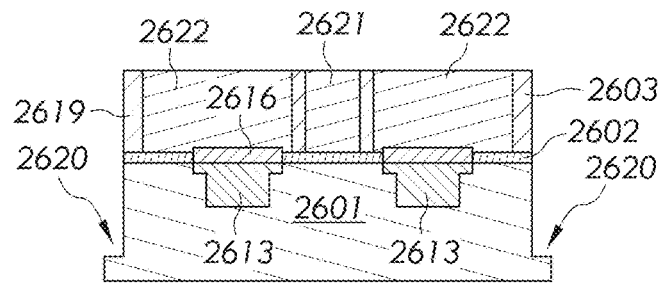

In step 2514, a CMP of gate metal 2617 is carried out to expose second material hard mask 2618, which is then etched away using gate metal 2617 as a mask as shown in FIG. 26N. Continuing with gate metal 2617 as an etch mask, first material hard mask 2619 is also etched using RIE to expose gate oxide. This would also define the dimensions of the final gate 2621 and S/D contacts 2622 as shown in FIG. 26N.

Figure 26O:
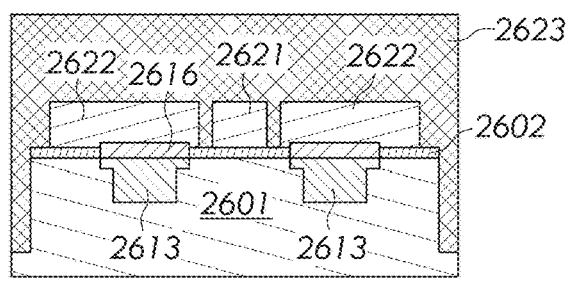

In step 2515, field isolation oxide 2623 is then blanket deposited onto the material stack as shown in FIG. 26O.

Figure 26P:
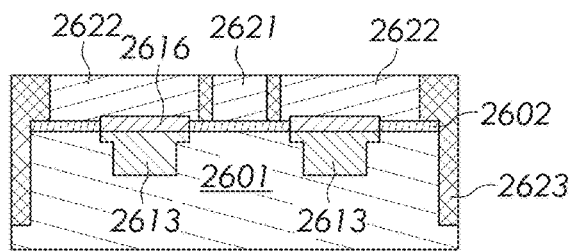

In step 2516, field oxide 2623 is planarized using CMP to expose metal contacts 2621 and 2622, thus forming a self-aligned NMOS MOSFET with lightly doped source and drain regions suitable for short-channel devices as shown in FIG. 26P.

Figure 27A:
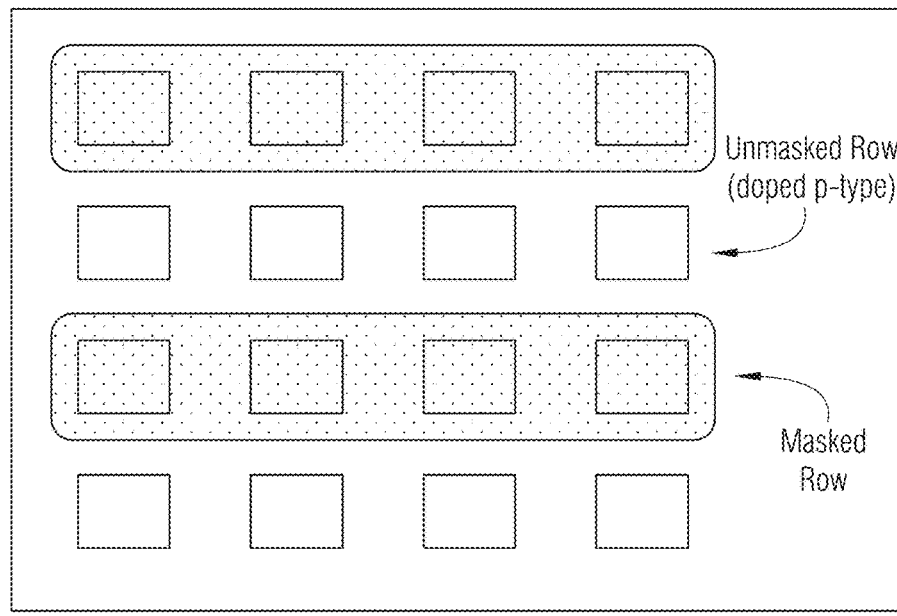
FIG. 27A illustrates the first lithography step for p-type dopant implantation in accordance with an embodiment of the present invention.

Referring to FIG. 25, with respect to the third method of fabricating MOSFET devices using the above two methods in conjunction with photolithography, a CMOS MOSFET device array can be fabricated using the process described above, with some minor changes. After matched etching in step 2504 to form the two hard mask levels (2608 and 2609), optical lithography is carried out to mask out an entire row of structures as shown in FIG. 27A. FIG. 27A illustrates the first lithography step for p-type dopant implantation in accordance with an embodiment of the present invention.

Figure 27B:
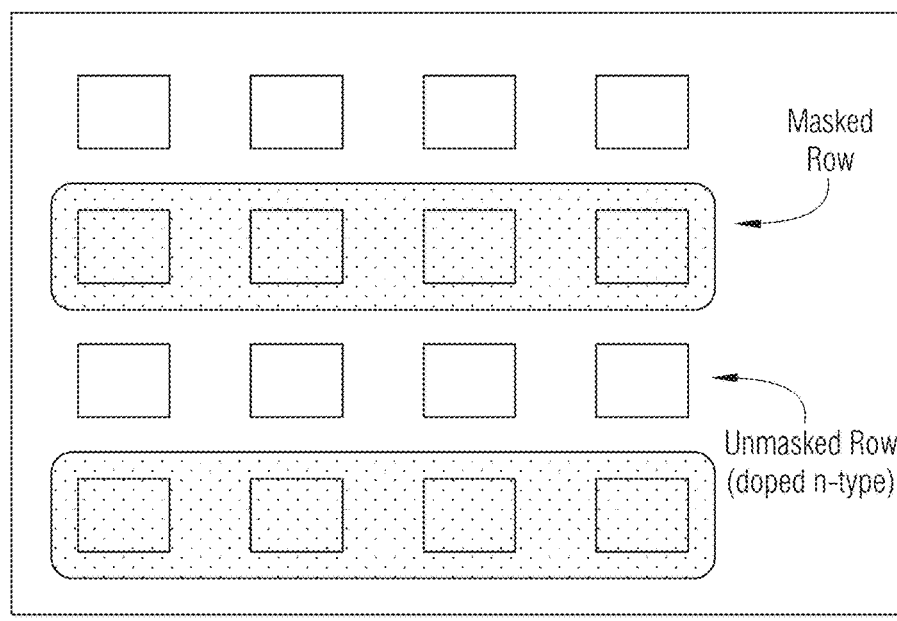
FIG. 27B illustrates the second lithography step for n-type dopant implantation in accordance with an embodiment of the present invention.

Then step 2505 is carried out to implant the first dopant (e.g. p-type). At this point alternating rows of structures are masked from ion implantation as shown in FIG. 27A. After step 2505, photoresist is stripped and a second optical lithography step is carried out to mask out previously p-doped structures as shown in FIG. 27B. FIG. 27B illustrates the second lithography step for n-type dopant implantation in accordance with an embodiment of the present invention. Now ion implantation is carried out on the undoped structures using the alternate dopant type, in this case n-type. Photoresist is then stripped to reveal alternating rows of n-type and p-type doped structures.

After this process, step 2506 is carried out and the process continues. A similar optical lithography step is performed after step 2507 to form highly doped p-type and n-type structures thus forming source and drain regions.

Figure 28:
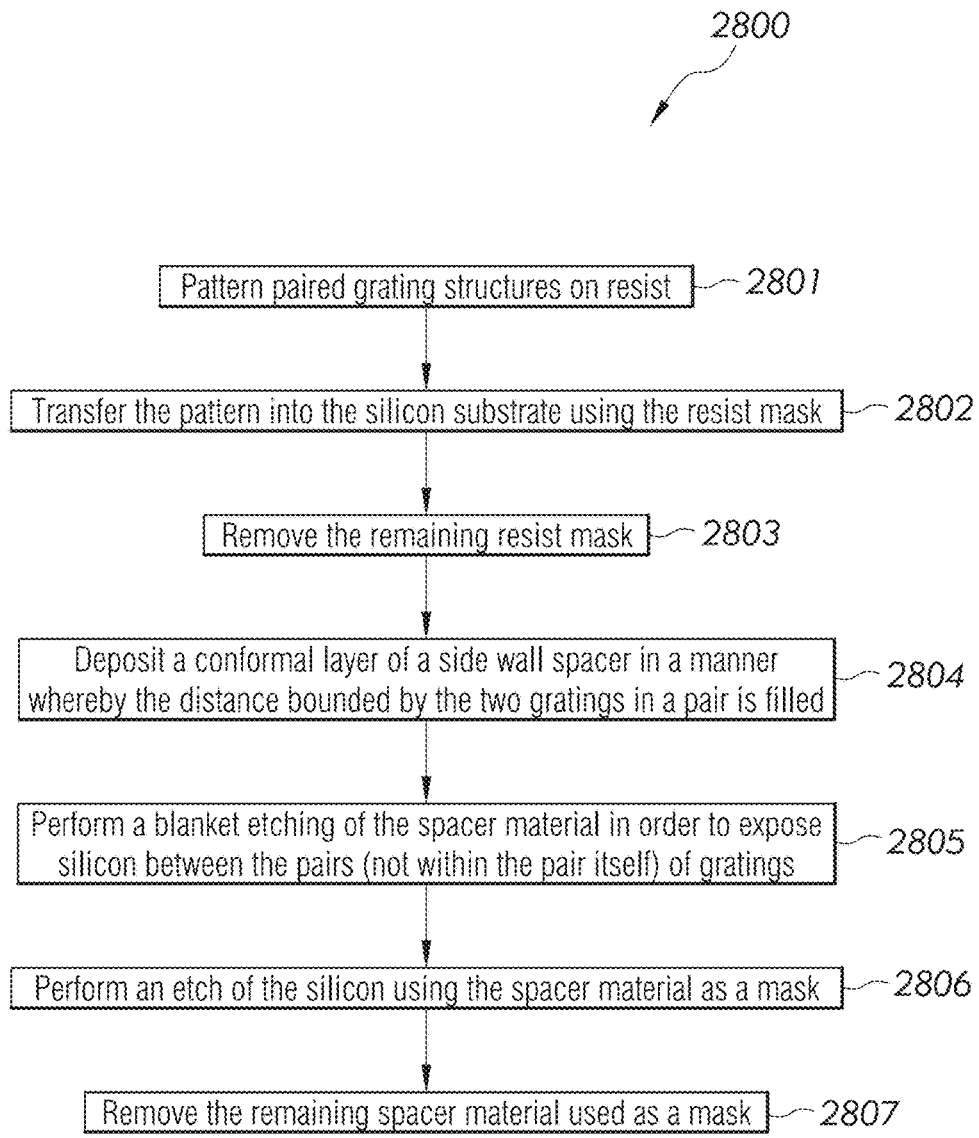
FIG. 28 is a flowchart of a method for fabricating a bilaterally symmetric structure in accordance with an embodiment.

Bilaterally symmetric multi-tier structures may also be fabricated using the principles of the present invention as discussed below in connection with FIGS. 28, 29A-29F. FIG. 28 is a flowchart of a method 2800 for fabricating a bilaterally symmetric structure in accordance with an embodiment. FIG. 28 will be discussed in conjunction with FIGS. 29A-29F, which depict cross-sectional views of fabricating a bilaterally symmetric structure using the steps described in FIG. 28 in accordance with an embodiment of the present invention.

Figure 29A:
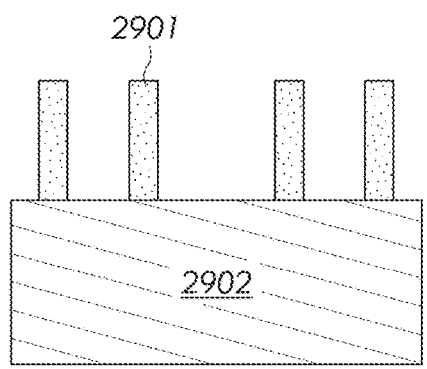
FIGS. 29A-29F depict cross-sectional views of fabricating a bilaterally symmetric structure using the steps described in FIG. 28 in accordance with an embodiment of the present invention.

Referring to FIG. 28, in step 2801, paired grating structures are patterned in resist 2901 as shown in FIG. 29A. In one embodiment, the paired grating structures are patterned on resist 2901 using nanoimprint lithography, electron beam lithography or photolithography on a substrate 2902 (e.g., silicon, fused silica).

In step 2802, the pattern is transferred into the silicon substrate 2902 using the resist mask 2901, such as by RIE, using HBr/Cl$_2$ chemistry.

Figure 29B:
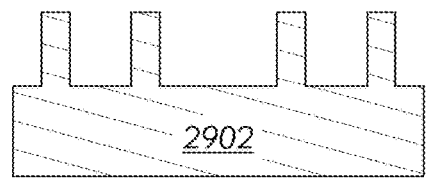

In step 2803, the remaining resist mask 2901 is removed, such as by wet piranha processing of the sample, as shown in FIG. 29B.

Figure 29C:
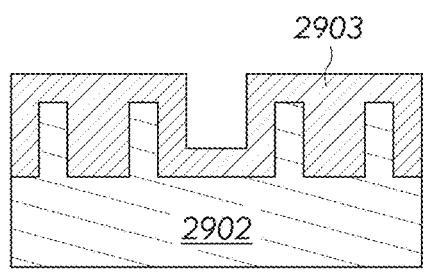

In step 2804, a conformal layer of a side wall spacer 2903 (e.g., silicon dioxide, titanium nitride) is deposited, such as via ALD, in a manner whereby the distance bounded by the two gratings in a pair is filled as shown FIG. 29C. That is, spacer material 2903 is deposited until an empty space within each of the paired grating structures is filled as shown in FIG. 29C.

Figure 29D:
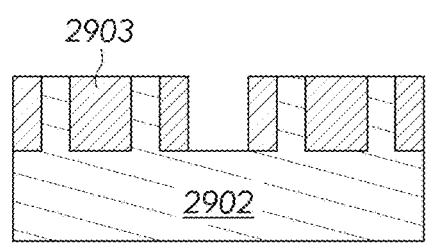

In step 2805, a blanket etching of the ALD SiO$_2$ film 2903 is performed in order to expose Si between the pairs (not within the pair itself) of gratings as shown FIG. 29D. In one embodiment, CF$_4$/Ar/CHF$_3$ etch chemistry is used for this process. At this stage, spacer material 2903 used as a mask for etching a second level into the Si wafer 2902 has been defined.

Figure 29E:
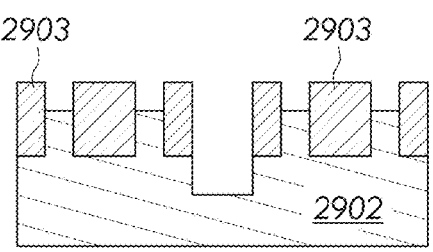
Figure 29F:
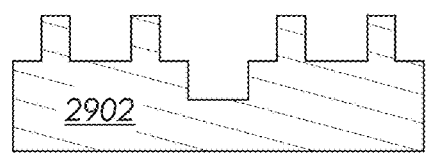

In step 2806, the silicon 2902 is etched, such as via RIE, using the spacer material 2903 as a mask as shown in FIG. 29E. In one embodiment, HBr/Cl$_2$ etch chemistry is used for this process.

In step 2807, once the etch process is completed, the remaining SiO$_2$ mask 2903 is removed, such as by wet processing. This process exposes the final structure (a bilaterally symmetric multi-tier structure) illustrated in FIG. 29F. In one embodiment, the bilaterally symmetric multi-tier structure is a master Si nanoimprint template.

During the etch carried out in step 2806, the exposed top level Si 2902 starts to etch. To ensure a smooth top level Si surface, a hard mask (such as SiO$_2$) can be deposited above the Si substrate 2902 prior to the initial patterning step. In one embodiment, the bilaterally symmetric structure created here serves as a master Si nanoimprint template. Each pair or bilateral structure is considered as one unit.

The master template containing the bilaterally symmetric multitier structures can then be used to create an inverse tone nanoimprint replica template that will be used to fabricate field-effect transistor structures. The process to fabricate the inverse tone nanoimprint replica template is discussed below in connection with FIGS. 30 and 31A-31F.

Figure 30:
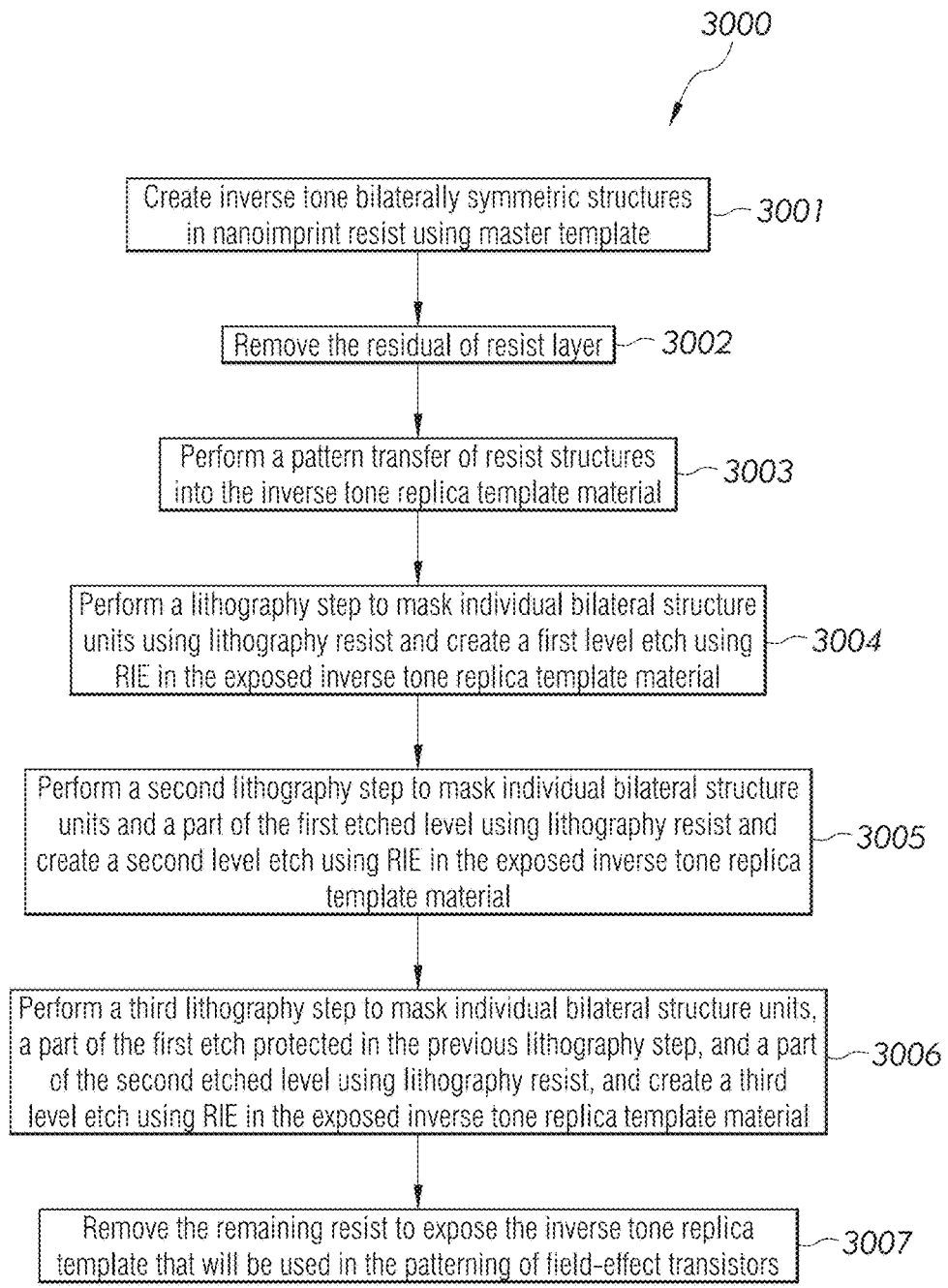
FIG. 30 is a flowchart of a method for fabricating the inverse tone nanoimprint replica template in accordance with an embodiment of the present invention.

FIG. 30 is a flowchart of a method 3000 for fabricating the inverse tone nanoimprint replica template in accordance with an embodiment of the present invention. FIG. 30 will be discussed in conjunction with FIGS. 31A-31F, which depict cross-sectional views of fabricating the inverse tone nanoimprint replica template using the steps described in FIG. 30 in accordance with an embodiment of the present invention.

Referring to FIG. 30, in step 3001, a master template is used to create inverse tone bilaterally symmetric structures in nanoimprint resist 3101 using nanoimprint lithography. In one embodiment, nanoimprint resist 3101 resides on the inverse tone replica template material 3102.

Figure 31A:
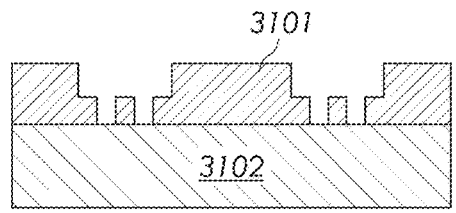
FIGS. 31A-31F depict cross-sectional views of fabricating the inverse tone nanoimprint replica template using the steps described in FIG. 34 in accordance with an embodiment of the present invention.

In step 3002, the residual of resist layer of the patterned resist 3101 is removed resulting in the structure shown in FIG. 31A.

Figure 31B:
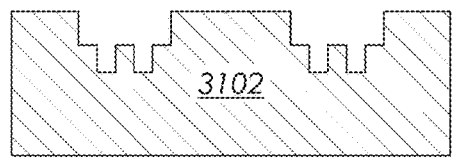

In step 3003, a pattern transfer of resist structures into the inverse tone replica template 3102 material (e.g., fused silica) is performed, such as by RIE, as shown in FIG. 31B.

Figure 31C:
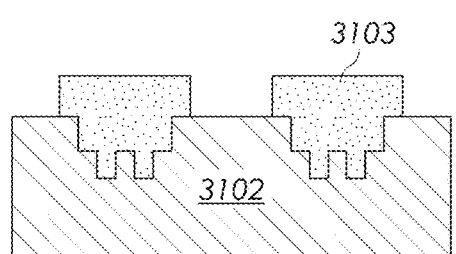

In step 3004, a lithography step is performed to mask individual bilateral structure units using lithography resist 3103 as shown in FIG. 31C. Using the resist as an etch mask, a first level etch using RIE is carried out in the exposed inverse tone replica template material 3102. After this etch, the remaining resist is stripped.

Figure 31D:
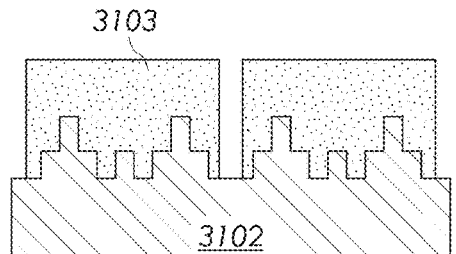

In step 3005, a second lithography step is performed to mask individual bilateral structure units and a part of the first etched level using lithography resist 3103 as shown in FIG. 31D. Using the resist as an etch mask, a second level etch using RIE is carried out in the exposed inverse tone replica template material 3102. After this etch, the remaining resist is stripped.

Figure 31E:
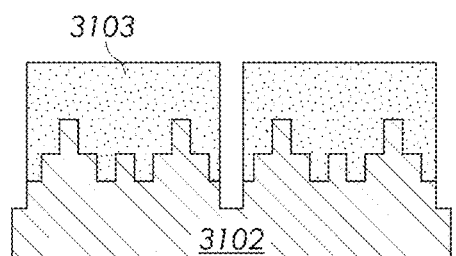

In step 3006, a third lithography step is performed as shown in FIG. 31E to mask individual bilateral structure units, a part of the first etch protected in the previous lithography step, and a part of the second etched level using lithography resist 3103, and create a third level etch using RIE in the exposed inverse tone replica template material 3102.

Figure 31F:
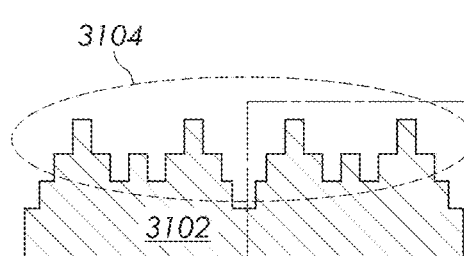

In step 3007, the remaining resist 3103 is removed to expose the inverse tone replica template 3104 that will be used in the patterning of field-effect transistors as shown in FIG. 31F. Box 3105 in FIG. 31F illustrates the portion of the imprint template 3104 that corresponds to an individual field-effect transistor. Since the bilaterally symmetric multi-tier structures were created in the master Si template using self-alignment techniques, there is no overlay error within individual devices. Photolithography is used only to isolate individual device structures from each other and the alignment capability needed for this process is not as stringent compared to alignment requirements within an individual device.

As discussed herein, the methods of the present invention enable multilevel nanoscale structure fabrication using a single patterning step. The multilevel structures may be symmetric, tubular, asymmetric, or bilaterally symmetric. The techniques of the present invention completely eliminate the need for alignment and overlay in the nanoscale. Furthermore, the present invention enables fabrication of self-aligned multi-tier nanoimprint templates and replication of self-aligned multi-tier nanoimprint templates to form replica templates. The present invention discloses methods for pattern transfer of multi-tier nanoscale features. Additionally, the present invention discloses methods to fabricate large area MIS Si tube capacitors, large area asymmetric multitier wire grid polarizers, and three variations of large area MOSFET arrays, all from a single patterning step.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for fabricating a bilaterally symmetric multi-tier structure, the method comprising:
    patterning a pair of grating structures on a substrate material;
    transferring said patterned pair of grating structures into said substrate material using a resist mask;
    removing said resist mask;
    depositing spacer material until an empty space within each of said pair of grating structures is filled;
    etching said spacer material anisotropically to define side wall spacers on the outer edges of said pair of grating structures;
    etching said substrate material using said side wall spacers as an etch mask to form a second lower level; and
    removing said spacer material to reveal a bilaterally symmetric multi-tier structure.

2. The method as recited in claim 1, wherein said paired grating structure is patterned using one of the following: nanoimprint lithography, electron beam lithography and photolithography.

3. The method as recited in claim 1, wherein said substrate comprises silicon, wherein said spacer material comprises silicon dioxide.

4. The method as recited in claim 1, wherein said substrate comprises fused silica, wherein said spacer material comprises titanium nitride.

5. The method as recited in claim 1, wherein said bilaterally symmetric multi-tier structure is a master nanoimprint template.

6. The method as recited in claim 5 further comprising:
    imprinting said bilaterally symmetric multi-tier structure in a resist layer forming resist structures on a template material using said master nanoimprint template.

7. The method as recited in claim 6 further comprising:
    removing a residual of said resist layer;
    performing a pattern transfer of said resist structures into said template material; and
    performing a plurality of lithography steps to isolate individual structures and create steps between said individual structures forming a replica template.

8. The method as recited in claim 7 further comprising:
    using said replica template to pattern a multi-tiered resist structure on a resist of a material stack comprising a substrate, a gate oxide layer formed directly on top of said substrate, a mask layer formed directly on top of said gate oxide layer and said resist formed directly on top of said mask layer;
    transferring said resist structure onto said mask layer to form a patterned mask structure;
    etching said gate oxide to expose said substrate;
    forming source and drain regions in said substrate using said patterned mask structure as an implant mask;
    depositing a metal layer onto said material stack to serve as a gate metal;
    planarizing said metal layer to expose a surface of said patterned mask structure;
    etching into said patterned mask structure until said gate oxide is exposed using said metal layer as a mask;
    further planarizing said metal layer until a remaining portion of said patterned mask structure is exposed thus forming a gate metal and source and drain metal contacts;
    etching into said exposed gate oxide and said substrate to form isolation trenches using said remaining portion of said patterned mask structure, said gate metal and said source and drain metal contacts as etch masks;
    removing said remaining portion of said patterned mask structure using said gate metal and said source and drain metal contacts as etch masks until said gate oxide is exposed; and
    depositing a field isolation oxide and planarizing said field isolation oxide until said gate metal and said source and drain metal contacts are exposed.

9. The method as recited in claim 7 further comprising:
    using said replica template to pattern a nanoimprint resist on a polymer resist of a material stack comprising a substrate, a gate oxide layer formed directly on top of said substrate, a mask layer of a first material formed directly on top of said gate oxide layer, a mask layer of a second material formed directly on top of said mask layer of said first material, and said polymer resist formed directly on top of said mask layer of said second material;
    removing said replica template after said polymer resist is cured thereby forming a negative multi-tier structure;
    etching a residual portion of said polymer resist after removal of said replica template;
    transferring said negative multi-tier structure onto said mask layers of said first material and said second material by matched etching to form a first and a second hard mask, respectively;
    performing an ion implantation using said first hard mask as an implant mask to form lightly doped source and drain regions in said substrate;
    performing a blanket deposit of a material onto said material stack;
    performing a blanket etch of said material to define side wall spacers;
    forming source and drain regions using said side wall spacers which serve as implant masks;
    etching and removing said first hard mask;
    performing a blanket deposit of a transition metal layer onto said material stack;
    forming a transition metal silicide or salicide at said source and drain regions by annealing said transition metal layer;

etching said transition metal layer;

performing a blanket deposit of a gate metal and planarizing said gate metal until a remaining portion of said second hard mask is exposed;

etching said second and exposed first hard masks using said gate metal as an etch masks;

forming isolation trenches by etching into said substrate using said gate metal as said etch mask;

performing a planarizing of said gate meal to expose said remaining portion of said second hard mask which is etched using said gate metal as said etch mask;

etching a remaining portion of said first hard mask using said gate metal as said etch mask to expose said gate oxide layer;

performing a blanket deposit of a field isolation oxide onto said material stack; and planarizing said field isolation oxide to expose metal contacts thereby forming a self-aligned field-effect transistor.

10. The method as recited in claim 9, wherein said mask layer of said first material is a different material than said mask layer of said second material, wherein said first and second materials comprise a nitride or an oxide.

11. The method as recited in claim 9 further comprising:

performing a first lithography to mask out an entire row of structures after transferring said multi-tier structure onto said mask layers of said first material and said second material by matched etching;

stripping said polymer resist after said performing of said ion implantation using said first hard mask as said implant mask to form said source and drain regions in said substrate; and performing a second lithography to mask out previously p-doped structures after said performing of said ion implantation using said first hard mask as said implant mask to form said source and drain regions in said substrate.

12. The method as recited in claim 9, wherein said transition metal layer comprises titanium.

\* \* \* \* \*